US012537529B2

(12) United States Patent
Kim et al.

(10) Patent No.: US 12,537,529 B2
(45) Date of Patent: Jan. 27, 2026

(54) CHAOTIC COMPUTER INCLUDING SPIN SOLITON, OPERATION METHOD OF CHAOTIC COMPUTER, AND CHAOTIC COMPUTING METHOD USING SPIN SOLITON

(71) Applicant: Samsung Electronics Co., Ltd., Suwon-si (KR)

(72) Inventors: Sang-Koog Kim, Seoul (KR); Junhoe Kim, Suwon-si (KR); Gyuyoung Park, Seoul (KR); Gwanhyeob Koh, Suwon-si (KR); Kilho Lee, Suwon-si (KR)

(73) Assignees: Samsung Electronics Co., Ltd., Gyeonggi-Do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 203 days.

(21) Appl. No.: 18/410,351

(22) Filed: Jan. 11, 2024

(65) Prior Publication Data
US 2024/0313782 A1   Sep. 19, 2024

(30) Foreign Application Priority Data

Mar. 15, 2023   (KR) ......................... 10-2023-0033922

(51) Int. Cl.
*H03K 19/18* (2006.01)
*H03K 19/23* (2006.01)

(52) U.S. Cl.
CPC ............. *H03K 19/23* (2013.01); *H03K 19/18* (2013.01)

(58) Field of Classification Search
CPC .......... G06N 7/08; H03K 19/18; H03K 19/20; H03K 19/23; H03K 3/59; H03K 17/90; H03K 17/965; H03K 17/97
See application file for complete search history.

(56) References Cited

U.S. PATENT DOCUMENTS 8,164,148 B2    4/2012  Kim et al.
10,164,077 B2   12/2018 Vaysset et al.
(Continued)

FOREIGN PATENT DOCUMENTS

KR   10-0819142 B1   4/2008
KR   10-1381853 B1   4/2014
(Continued)

OTHER PUBLICATIONS

<https://en.wikipedia.org/wiki/Logistic_map>.
(Continued)

*Primary Examiner* — Jason M Crawford
(74) *Attorney, Agent, or Firm* — Harness, Dickey & Pierce, P.L.C.

(57) ABSTRACT

An operating method of a chaotic computer including a chaotic logic device includes setting a first initial value based on a first initial state corresponding to a first logical operation, applying the set first initial value to the chaotic logic device, setting a first input value to be applied to the chaotic logic device based on first input data, applying the first input value to the chaotic logic device, generating a chaos signal to have the chaotic logic device operate in a chaotic mode, applying the chaos signal to the chaotic logic device, and measuring a first output value from the chaotic logic device operating based on the first input value and the chaos signal, and generating first output data based on the first output value. The chaotic logic device includes a magnetic thin film configured to have spin soliton formed therein.

20 Claims, 18 Drawing Sheets

(56) References Cited

U.S. PATENT DOCUMENTS

| | | | |
|---|---|---|---|
| 10,269,402 B2 | 4/2019 | Andrikopoulos et al. | |
| 10,778,229 B1 | 9/2020 | Osborn et al. | |
| 2010/0176428 A1* | 7/2010 | Hong | H01F 10/3254 257/295 |
| 2016/0087634 A1* | 3/2016 | Ditto | H03K 19/17744 341/155 |
| 2016/0133827 A1* | 5/2016 | Lew | G11C 11/14 326/47 |
| 2020/0412366 A1 | 12/2020 | Friedman et al. | |
| 2021/0056455 A1* | 2/2021 | Shehab | G06F 9/4403 |
| 2021/0367141 A1* | 11/2021 | Xiao | H03K 19/18 |
| 2021/0408369 A1 | 12/2021 | Liu | |
| 2024/0313782 A1* | 9/2024 | Kim | H03K 19/23 |

FOREIGN PATENT DOCUMENTS

| | | |
|---|---|---|
| KR | 10-1679776 B1 | 11/2016 |
| KR | 10-2159756 B1 | 9/2020 |
| KR | 10-2361299 B1 | 2/2022 |
| KR | 10-2469824 B1 | 11/2022 |

OTHER PUBLICATIONS

Hyunsung Jung et al., "Logic Operations Based on Magnetic-Vortex-State Networks", ACS Nano, vol. 6, No. 5, pp. 3712-3717 (2012).

Albert Fert et al., "Magnetic skyrmions: advances in physics and potential applications", Nature Reviews Materials vol. 2, Article No. 17031, pp. 1-15, (2017).

Kyoung-Woong Moon et al. "Duffing oscillation-induced reversal of magnetic vortex core by a resonant perpendicular magnetic field," Scientific Reports, vol. 4, Article No. 6170, pp. 1-5, (2014).

Sudeshna Sinha et al., Dynamics Based Computation, Physical Review Letters Sep. 7, 1998.

Sebastien Petit-Watelot et al., Commensurability and chaos in magnetic vortex oscillations, Nature Physics vol. Sep. 8, 2012.

* cited by examiner

[Initial Stage]

[Input Stage #1]

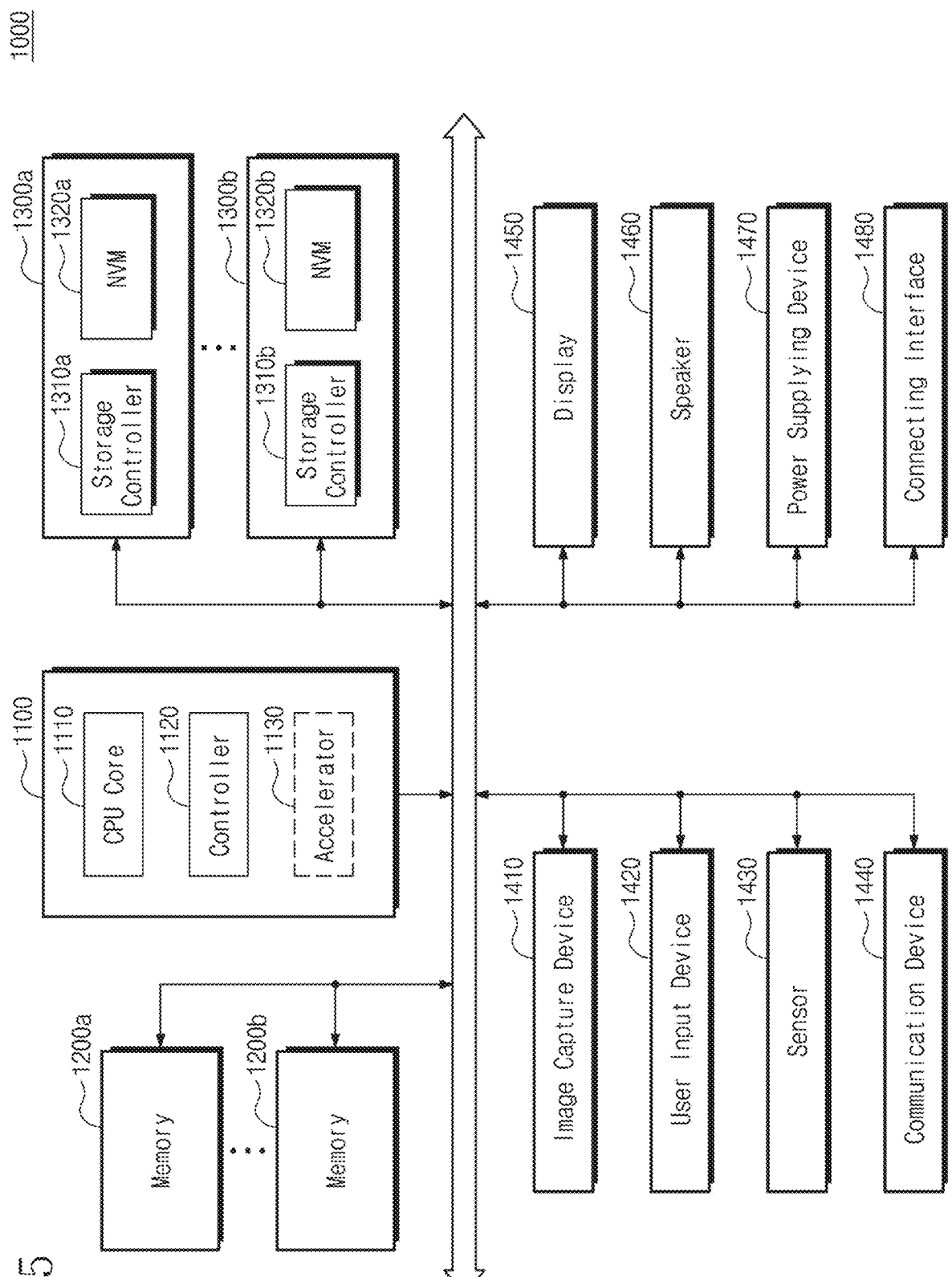

CHAOTIC COMPUTER INCLUDING SPIN SOLITON, OPERATION METHOD OF CHAOTIC COMPUTER, AND CHAOTIC COMPUTING METHOD USING SPIN SOLITON

CROSS-REFERENCE TO RELATED APPLICATIONS

This application claims priority under 35 U.S.C. § 119 to Korean Patent Application No. 10-2023-0033922 filed on Mar. 15, 2023, in the Korean Intellectual Property Office, the disclosures of which are incorporated by reference herein in their entireties.

BACKGROUND

Various example embodiments described herein relate to a computing system, and more particularly, relate to a chaotic computer including a spin soliton, a method of operating the chaotic computer, and/or a chaotic computing method using a spin soliton.

A computing system may provide various user experiences by performing various logical operations on data. In general, the logical operations performed by the computing system are performed by using transistor-based logic gates. The logic gates are designed and manufactured to perform various predetermined logical operations. Accordingly, the logic gate once manufactured may perform only a specific logical operation. To perform a complex logical operation, a plurality of logic gates need to be connected in series.

Various computing techniques based on parallel operations have been recently developed to overcome the above-described issues of logic gate-based operations.

SUMMARY

Some example embodiments provide a chaotic computer including a spin soliton having improved performance and reduced costs, a method of operating the chaotic computer, and/or a chaotic computing method using a spin soliton.

According to various example embodiments, an operating method of a chaotic computer including a chaotic logic device includes setting a first initial value based on a first initial state corresponding to a first logical operation, applying the set first initial value to the chaotic logic device, setting a first input value to be applied to the chaotic logic device based on first input data, applying the first input value to the chaotic logic device, generating a chaos signal to have the chaotic logic device operate in a chaotic mode, applying the chaos signal to the chaotic logic device, and measuring a first output value from the chaotic logic device operating based on the first input value and on the chaos signal, and generating first output data based on the first output value. The chaotic logic device includes a magnetic thin film configured to have a spin soliton formed therein.

Alternatively or additionally according to various example embodiments, a chaotic computing method using a spin soliton includes setting the spin soliton to a first initial state, applying a first input value based on first input data and on a chaos signal to the spin soliton, measuring a first output value and generating first output data based on the first output value while the spin soliton of the first initial state generates a chaotic behavior in response to the first input value and to the chaos signal, setting the spin soliton to a second initial state, applying the first input value and the chaos signal to the spin soliton, and measuring a second output value and generating second output data based on the second output value while the spin soliton of the second initial state generates a chaotic behavior in response to the first input value and the chaos signal. Each of the first initial state and the second initial state of the spin soliton independently indicates a location of a central spin of the spin soliton, or a shape of the spin soliton.

Alternatively or additionally according to various example embodiments, a chaotic computer includes a chaotic logic device including a magnetic thin film configured to have a spin soliton formed therein, and a processor configured to execute machine-readable instructions that, when executed by the processor, cause the chaotic computer to generate an initial value to be applied to the chaotic logic device based on an initial state corresponding to a target logical operation, to generate an input value to be applied to the chaotic logic device based on input data, to generate a chaos signal such that the chaotic logic device operates in a chaotic mode, to measure an output value from the chaotic logic device and to generate output data based on the output value while the chaotic logic device operates in the chaotic mode in response to the input value and the chaos signal. The output data corresponds to a result of the target logical operation for the input data.

BRIEF DESCRIPTION OF THE FIGURES

The above and other objects and features of the various example embodiments will become apparent by describing in detail embodiments thereof with reference to the accompanying drawings.

FIG. 15 is a diagram illustrating a system 1000, according to various example embodiments.

DETAILED DESCRIPTION

Hereinafter, some example embodiments may be described in detail and clearly to such an extent that an ordinary one in the art easily implements example embodiments.

According to various example embodiments, a plurality of logical operations may be performed by using a chaotic logic device (e.g., a single device). For example, when a chaotic behavior occurs in a spin soliton included in a chaotic logic device, physical characteristics and/or patterns of the spin soliton are sensitively transformed depending on an initial condition. For example, a logical operation corresponding to an initial condition and/or initial state may be performed by setting the initial condition and/or initial state of the chaotic logic device to a specific state, and generating a chaotic behavior. In this case, the switching between various logical operations may be more easily made by using one device, thereby reducing system manufacturing costs and/or overall system performance.

Figure 1:
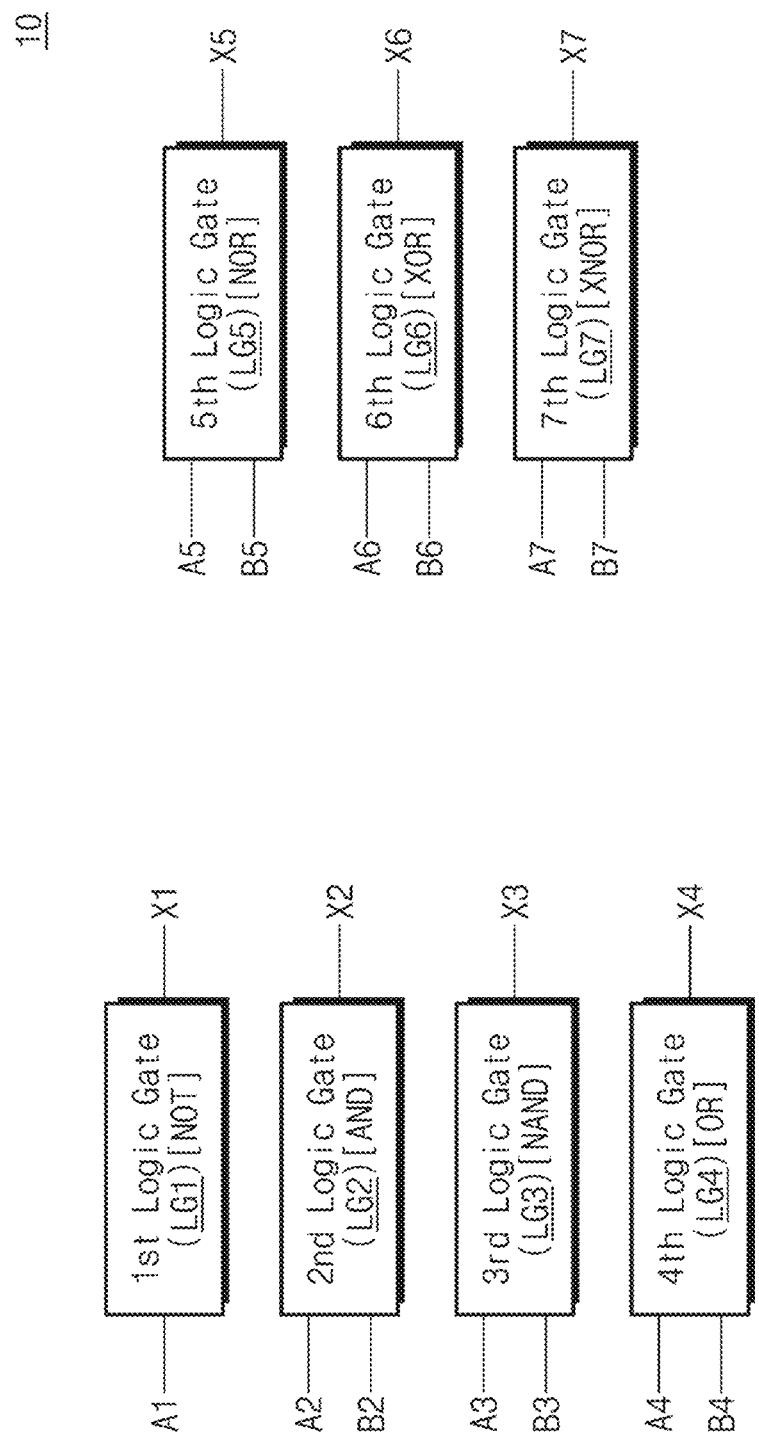
FIG. 1 is a diagram showing examples of various logical operation gates used in a computing system.

FIG. 1 is a diagram showing examples of various logical operation gates used in a computing system. Referring to FIG. 1, a computing system 10 may perform various logical operations by using a plurality of logic gates NOT, AND, NAND, OR, NOR, XOR, and XNOR. In some example embodiments, each of the plurality of logic gates NOT, AND, NAND, OR, NOR, XOR, and XNOR may perform only the specified logical operation.

For example, a first logic gate LG1 may output a first result value X1 by performing a NOT operation on a first input A1. A second logic gate LG2 may output a second result value X2 by performing an AND operation on second inputs A2 and B2. A third logic gate LG3 may output a third result value X3 by performing a NAND operation on third inputs A3 and B3. A fourth logic gate LG4 may output a fourth result value X4 by performing an OR operation on fourth inputs A4 and B4. A fifth logic gate LG5 may output a fifth result value X5 by performing a NOR operation on fifth inputs A5 and B5. A sixth logic gate LG6 may output a sixth result value X6 by performing an XOR operation on sixth inputs A6 and B6. A seventh logic gate LG7 may output a seventh result value X7 by performing an XNOR operation on seventh inputs A7 and B7.

As described above, each of the plurality of logic gates LG1 to LG7 may perform only the specified logical operation. Before a complex logical operation involving more than one logic gate and/or more than two inputs (e.g., (A XOR B) AND C, etc.) different from the shown basic logical operations is performed, separate logic gates corresponding thereto need to or are to be designed and manufactured. Moreover, a combination of the above-described plurality of logic gates LG1 to LG7 (i.e., logic gates for basic logical operations) is required or used to perform the complex logical operation. In this case, because a serial operation for inputs is performed, there may be a limitation on a computation time (i.e., performance).

Figure 2:
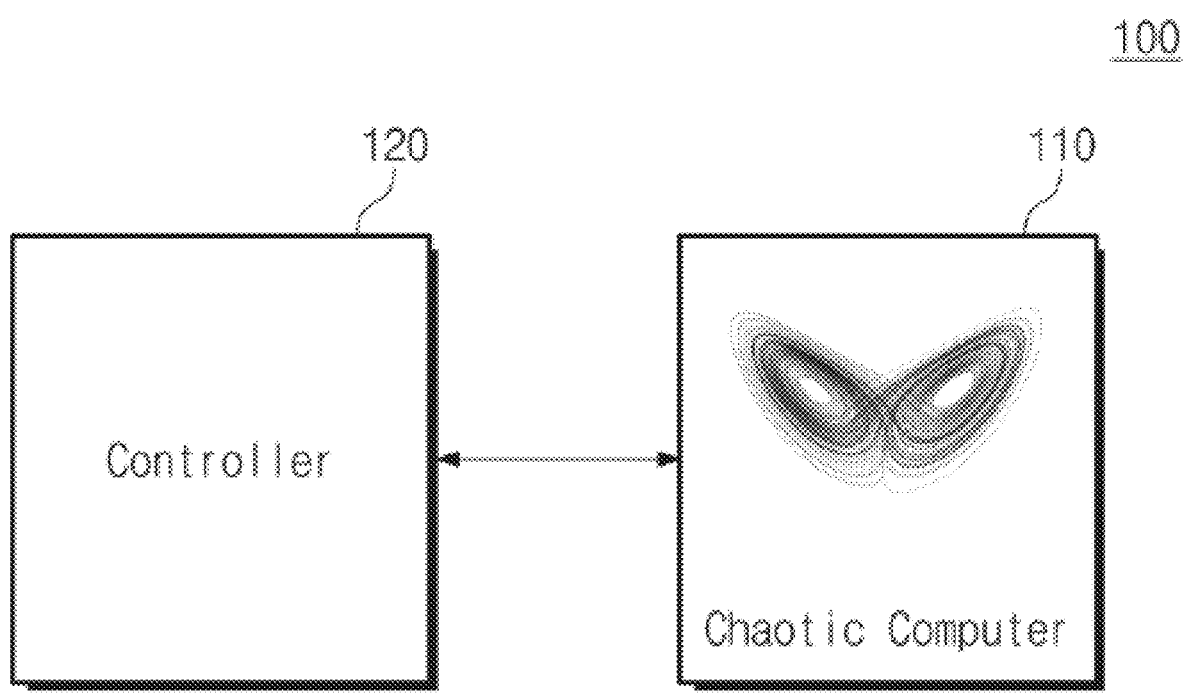
FIG. 2 is a block diagram showing a chaotic computer system, according to various example embodiments.

FIG. 2 is a block diagram showing a chaotic computer system, according to some example embodiments. Referring to FIG. 2, a chaotic computer system 100 may include a chaotic computer 110 and a controller 120. Under control of the controller 120, the chaotic computer 110 may be configured to perform various logical operations. In some example embodiments, the chaotic computer system 100 may be a device or system configured to perform various logical operations by using a single device (e.g., a chaotic logic device), based on a chaotic system.

For example, to overcome or at least partially overcome limitations of the logic gate-based computing system 10 described with reference to FIG. 1, various next-generation computing techniques are being developed. As an example, the next-generation computing techniques may include a neuromorphic computing technique imitating a nervous system, a quantum computing technique using quantum effects such as one or more of entanglement, superposition, and interference, and/or the like. Because the above-mentioned next-generation computing techniques are based on a parallel operation, the limitations of the serial operation of the computing system 10 based on the logic gate described with reference to FIG. 1 may be resolved or at least partly resolved. However, the neuromorphic computing technique requires or uses a weight update through pre-training, and the quantum computing technique is very sensitive due to quantum errors such as but not limited to decoherence. In some example embodiments, the above-mentioned next-generation computing techniques (e.g., the neuromorphic computing technique, the quantum computing technique, and the like) are configured to perform various calculations by using a static energy state.

On the other hand, the chaotic computer system 100 according to various example embodiments may be configured to perform various operations by using a change in a dynamic system. Accordingly, compared to a conventional computing system and/or to other next-generation computing techniques, the chaotic computer system 100 according to some example embodiments may have improved performance and reduced costs.

In some example embodiments, the chaotic computer system 100 may be improved or optimized for a fault-tolerant system (e.g., a safety-critical system). This may be due to the "orbital compactness" of a chaotic system. For example, the chaotic computer system 100 according to some example embodiments may perform various logical operations based on a chaotic system having topological mixability and/or orbital compactness, thereby implementing an error-tolerant system (e.g., a fault-tolerant system). In some example embodiments, the fault-tolerant system may include one or more of a power system, a nuclear power system, a defense system, and a space equipment system. In some example embodiments, the chaotic computer system 100 according to some example embodiments may use a spin soliton formed on a magnetic thin film. Accordingly, the chaotic computer system 100 according to some example embodiments may be more effectively utilized in an intensive semiconductor system in consideration of the physical characteristics or and/spatiotemporal scale of a magnetic body (or a nano-magnetic body). For example, the chaotic computer system 100 according to some example embodiments may be used as one or more of a life support device, an operating device of a robot or equipment in an extreme environment, or the like.

As described above, the chaotic computer 110 may be configured to perform various logical operations based on a chaotic system. Because the chaotic system generates a plurality of behavioral patterns and performs a switch between the generated behavioral patterns, the chaotic system has an irregular character. The switch between the behavioral patterns may be sensitive to an initial condition. For example, a pattern expressed in the chaotic system may be variously changed depending on the initial condition.

The chaotic computer 110 may include a chaotic logic device. The chaotic logic device may be configured to perform various logical operations. For example, the chaotic logic device may have various dynamic patterns depending on the initial state. That is, even when the same input value is applied to the chaotic logic device, various dynamic patterns may appear depending on the initial state of the chaotic logic device. In some example embodiments, the initial state (or initial status) used in this specification may correspond to the initial condition in the chaotic system. For example, in, it will be understood that setting or determining the initial state may have a similar meaning to setting an initial condition in the chaotic system.

As a more detailed example, when a chaotic logic device is set to a first initial state, the chaotic logic device may have a pattern corresponding to a result of a first logical operation for input data in response to input values. Alternatively, when the chaotic logic device is set to a second initial state, the chaotic logic device may have a pattern corresponding to a result of a second logical operation for input data in response to the same input values. For example, a chaotic logic device may have innumerable dynamic patterns depending on the initial state, and the dynamic patterns may correspond to different logical operations, respectively.

As described above, according to, the chaotic computer 110 may be configured to perform various logical operations based on the dynamic patterns of the chaotic logic device. Accordingly, various logical operations may be performed by using a single device, thereby implementing a computing system based on reduced costs compared to a conventional logic gate-based operation.

In some example embodiments, the chaotic logic device included in the chaotic computer 110 may be or may include, or be included in, a device having a topology spin soliton. For example, the chaotic logic device may include a topology soliton or a topological spin soliton. For example, the topology spin soliton may include various shapes, each of which has a spin structure, such as a target skyrmion (including a skyrmion, a vortex, skyrmionium, or the like), a meron, hopfion, antiparticles thereof (e.g., anti-skyrmion, etc.), and twin antiparticles thereof (e.g., bi-skyrmion, etc.).

Hereinafter, to clearly describe, it may be assumed that the chaotic logic device includes a device in which some structures (e.g., a skyrmion) are formed. However, the scope of example embodiments is not limited thereto. For example, it will be understood that the chaotic logic device may be implemented with the above-described examples of topology spin soliton or devices, in each of which another similar spin soliton structure is formed.

Hereinafter, for convenience of description, the topology soliton or topology spin soliton is referred to as a "spin soliton". The spin soliton may include various shapes, each of which has a spin structure, such as one or more of a target skyrmion (including a skyrmion, a vortex, skyrmionium, or the like), a meron, hopfion, antiparticles thereof (e.g., anti-skyrmion, etc.), and twin antiparticles thereof (e.g., bi-skyrmion, etc.).

In some example embodiments, the controller 120 may provide the chaotic computer 110 with input data and information about a target logical operation. The chaotic computer 110 may set the initial state of the chaotic logic device based on the information about the target logical operation received from the controller 120, and may perform the target logical operation on the input data. A configuration and an operation of the chaotic computer 110 will be more fully described with reference to the following drawings.

In various example embodiments, the controller 120 may communicate with the chaotic computer 110 in a wired manner, and/or in a wireless manner, to exchange, e.g., to transfer and/or to receive, information such as but not limited to commands and/or data, in a serial and/or in a parallel manner, with analog and/or digital information.

Figure 3A:
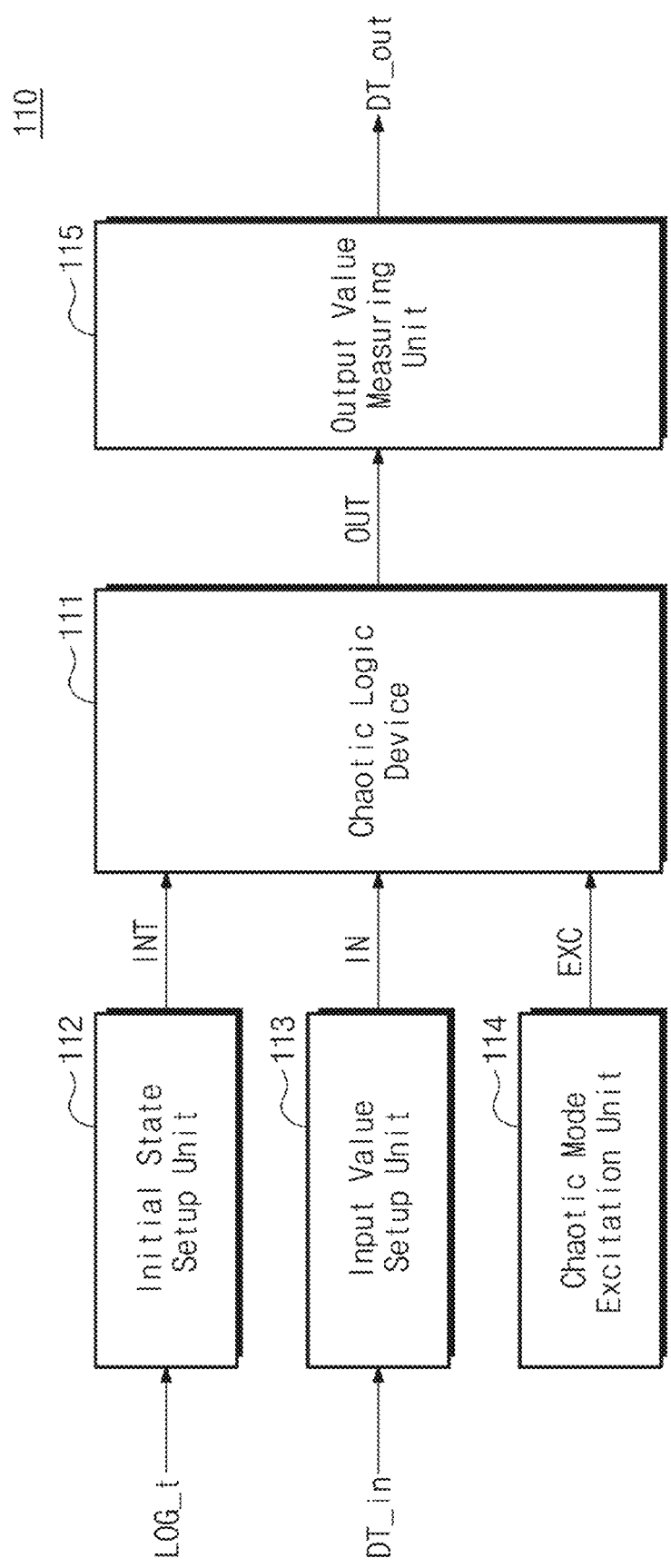
FIGS. 3A and 3B are block diagrams showing the chaotic computer of FIG. 2.
Figure 3B:
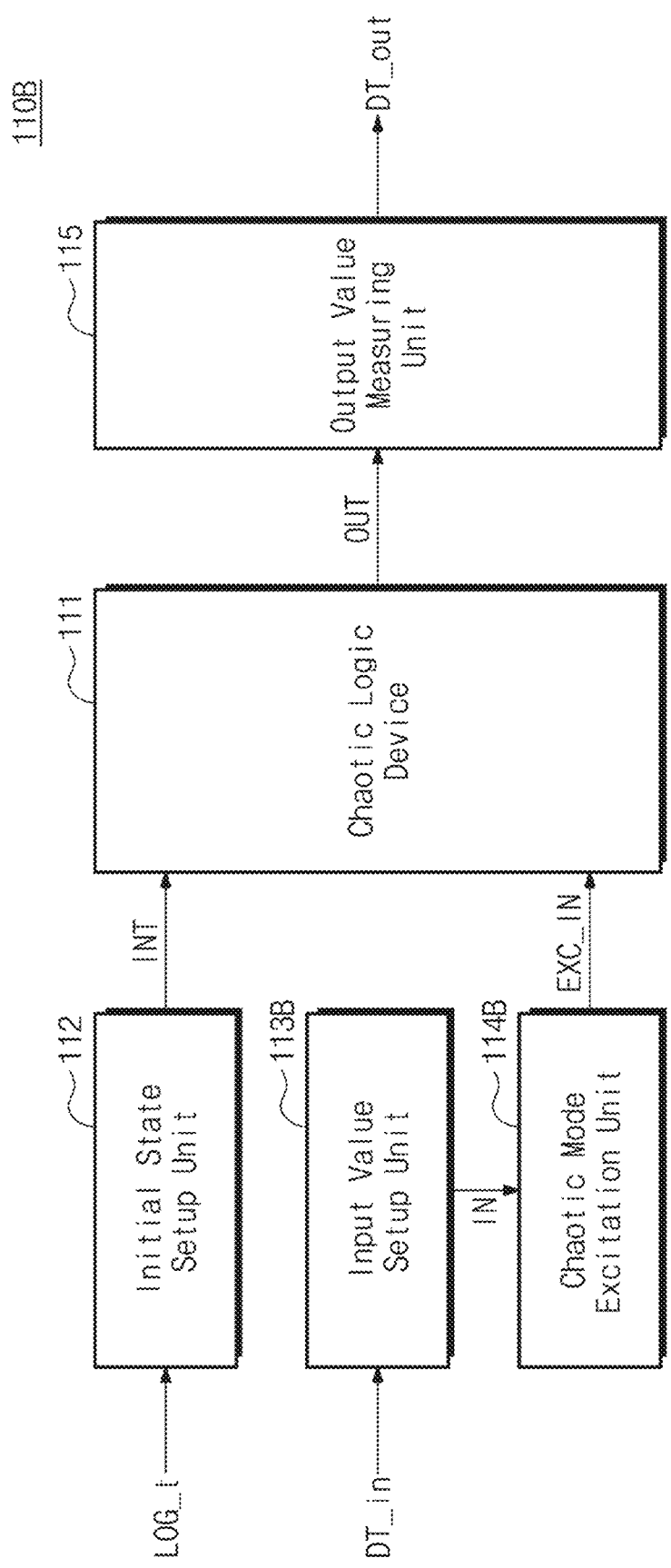

FIGS. 3A and 3B are block diagrams showing the chaotic computer of FIG. 2. Referring to FIGS. 2 and 3A, the chaotic computer 110 may include a chaotic logic device 111, an initial state setup unit 112, an input value setup unit 113, a chaotic mode excitation unit 114, and an output value measuring unit 115. In some example embodiments, the initial state setup unit 112, the input value setup unit 113, and the chaotic mode excitation unit 114 may be included in the controller 120 and may be implemented as a single device.

The chaotic logic device 111 may include a spin soliton. Alternatively or additionally, the chaotic logic device 111 may include a magnetic thin film and/or magnetic material, in which a spin soliton is formed or is configured to be formed. In some example embodiments, the spin soliton may be or may include or be included in a skyrmion. The skyrmion may be or may correspond to a spin structure having a shape of a vortex, and may refer to a structure in which central and peripheral spins of the skyrmion have anti-parallel states, and spins between the central spin and the peripheral spin are arranged in the shape of a vortex. However, the scope of example embodiments is not limited thereto. For example, the spin soliton may include various shapes, each of which has a spin structure, such as a target skyrmion (including one or more of a skyrmion, a vortex, skyrmionium, or the like), a meron, hopfion, antiparticles thereof (e.g., anti-skyrmion, etc.), and twin antiparticles thereof (e.g., bi-skyrmion, etc.).

In some example embodiments, the skyrmion may be formed of a material which is obtained through deposition such that a ferromagnetic material such as one or more of cobalt (Co), iron (Fe), nickel (Ni), an iron-cobalt alloy, or a cobalt-iron-boron alloy is in contact with a thin film having strong spin-orbit coupling such as one or more of platinum (Pt), tungsten (W), and tantalum (Ta), or is in contact with a material, which has broken inversion symmetry in a crystal structure, such as one or more of a silicon-manganese alloy (MnSi), a silicon-iron-cobalt alloy (Fe1-xCoxSi), iron-germanium (FeGe), or the like.

In some example embodiments, the spin soliton included in the chaotic logic device 111 may be a vortex. The vortex may be formed in a magnetic thin film structure, and the magnetic thin film structure may be formed of a ferromagnetic material. For example, a material such as one or more of cobalt (Co), iron (Fe), nickel (Ni), an iron-nickel alloy, an iron-nickel-cobalt alloy, or an iron-nickel-molybdenum alloy may be used as the ferromagnetic material. For example, as described above, the chaotic logic device 111 according to some example embodiments may include various magnetic thin film structures and/or magnetic material layers having various other characteristics, and various types of spin solitons may be formed in a magnetic thin film structure or a magnetic material layer.

The chaotic logic device 111 may have various dynamic patterns depending on the initial state (or the state of a spin soliton). For example, when the spin soliton included in the chaotic logic device 111 has a first initial state, the chaotic logic device 111 may have a first pattern for an input value. When the spin soliton included in the chaotic logic device 111 has a second initial state different from the first initial state, the chaotic logic device 111 may have a second pattern for the same input value. In this case, a measurement value corresponding to the first pattern may correspond to a result of a first logical operation for the input value. A measurement value corresponding to the second pattern may correspond to a result of a second logical operation for the input value. For example, the chaotic logic device 111 may be configured to perform various logical operations depending on the initial state.

The initial state setup unit 112 may be configured to set the initial state of the chaotic logic device 111. For example, the initial state setup unit 112 may receive information about a target logical operation LOG_t from the controller 120. The initial state setup unit 112 may determine an initial state of the chaotic logic device 111 corresponding to the target logical operation LOG_t. The initial state setup unit 112 may apply an initial value INT to the chaotic logic device 111 such that the chaotic logic device 111 has the determined initial state.

As an example, the initial state of the chaotic logic device 111 may indicate the central spin location and/or shape (e.g., the radius and/or flatness of a spin soliton, etc.) of a spin soliton. As an example, the initial value INT may indicate a static magnetic field applied to the chaotic logic device 111. However, the scope of example embodiments is not limited thereto. For example, the initial value for setting the initial state of the chaotic logic device 111 may be replaced with an electric field (e.g., one or more of a voltage, a current, resistance, or the like) or light instead of or in addition to the static magnetic field. Alternatively or additionally, the initial value for setting the initial state of the chaotic logic device 111 may include an alternating magnetic field or a magnetic field pulse.

In some example embodiments, when the initial value INT is applied to the chaotic logic device 111 by the initial state setup unit 112, the central spin location or shape of the spin soliton included in the chaotic logic device 111 may be changed. That is, the initial state of the chaotic logic device 111 may be determined by the central spin location or shape of the spin soliton.

The input value setup unit 113 may receive input data DT_in from the controller 120. The input value setup unit 113 may set an input value IN to be applied to the chaotic logic device 111 based on the input data DT_in.

For example, it may be assumed that the input data DT_in includes 2-bit data. In this case, the input value setup unit 113 may control a magnetic field in a first direction to be applied to the chaotic logic device 111 based on the first bit of the input data DT_in, and may control a magnetic field in a second direction to be applied to the chaotic logic device 111 based on the second bit of the input data DT_in. The first and second directions may be orthogonal to each other or may be antiparallel with each other; example embodiments are not limited thereto.

Alternatively or additionally, the input value setup unit 113 may control the strength of a magnetic field in the first direction to be applied to the chaotic logic device 111 based on the first bit of the input data DT_in, and may control the strength of the magnetic field in the first direction to be applied to the chaotic logic device 111 based on the second bit of the input data DT_in.

In some example embodiments, input data to be operated by the chaotic logic device 111 may include a plurality of bits (e.g., multi-inputs), and the input value setup unit 113 may control an input value to be applied to the chaotic logic device 111 based on the plurality of bits. In some example embodiments, the input value determined or controlled based on the input data DT_in may be an alternating magnetic field provided to the chaotic logic device 111. However, the scope of the present disclosure is not limited thereto. For example, the input value may be at least one of various physical quantities such as a static magnetic field, an electrostatic field, a direct current, an alternating current, or an alternating electric field.

The chaotic mode excitation unit 114 may control a chaos signal EXC such that the chaotic logic device 111 operates in a chaotic mode. Hereinafter, a term of "chaotic mode (or chaos mode)" is used. The chaotic mode may indicate an operating mode in which the chaotic logic device 111 and/or a spin soliton included in the chaotic logic device 111 generates a chaotic behavior. For example, the fact that the chaotic logic device 111 operates in the chaotic mode may mean that a spin soliton included in the chaotic logic device 111 generates a chaotic behavior. The chaotic behavior refers to a physical property based on chaotic dynamics, and the chaotic dynamics has a mode capable of appearing in a nonlinear dynamics system, and has a characteristic of sensitively changing a behavior result in an initial state of the system.

For example, as described above, the chaotic logic device 111 may include a skyrmion that is the type of a spin soliton. The skyrmion may have a unique mode. The unique mode may include a breathing mode or oscillating mode or two types of a circular mode or gyration mode.

In some example embodiments, in a high-frequency signal, the skyrmion may have more complex modes. In this case, in the circular mode, the breathing mode, and harmonic modes thereof, which correspond to the unique mode, the skyrmion may exhibit a nonlinear behavior at a frequency that does not match an eigenfrequency in each unique mode. In this case, when the frequency of an alternating magnetic field of the input value is identically matched with a frequency corresponding to a mode in which the skyrmion exhibits the nonlinear behavior, and the strength of the alternating magnetic field is increased to be greater than or equal to a threshold value, the skyrmion may operate in a chaotic mode. For example, in an alternating magnetic field at a first frequency, a skyrmion may exhibit the nonlinear behavior. In this case, when the frequency of the alternating magnetic field applied to the skyrmion is set to the first frequency and the strength of the alternating magnetic field is increased to be greater than or equal to the threshold value, the skyrmion may operate in the chaotic mode.

When the skyrmion operates in the chaotic mode, the expressed pattern may be different depending on the initial state (e.g., the central spin location or shape of the skyrmion) set in the chaotic logic device 111 even though the applied input value is the same (i.e., the input data is the same). For example, even when the input value is the same, the final operation result obtained or measured from the skyrmion may be different. This may indicate that the chaotic logic device 111 may perform various logical operations depending on the initial state.

In some example embodiments, in a nonlinear dynamics system, the chaotic mode is expressed at a threshold point or higher. In this case, the threshold point may mean a nonlinear point, in which a nonlinear dynamical system exhibits a regular behavior and then exhibits the chaotic behavior, from among bifurcation points. For example, a method of operating the chaotic logic device 111 in the chaotic mode or causing the chaotic behavior includes finding a threshold point for the chaotic logic device 111 and generating a behavior at nonlinearity having the threshold point or higher. For example, when an alternating magnetic field having a specific frequency is applied, the strength of the alternating magnetic field may be a key factor inducing the chaotic behavior in a system where the spin soliton included in the chaotic logic device 111 is a skyrmion. In some example embodiments, it may be assumed that the chaotic logic device 111 includes a Co/Pt thin film in which a skyrmion having a diameter of 60 nm is formed or is configured to be formed. In this case, when a linear alternating magnetic field is applied to the chaotic logic device 111, the chaotic behavior is induced at the magnetic field strength of about 43 mT or higher. This value may be smaller depending on the frequency or regularity of the alternating magnetic field. As in the above description, with respect to various methods of driving a skyrmion (e.g., one or more of a circular alternating magnetic field, an alternating current, a perpendicular current to a thin film, a spin current, or the like), different nonlinearity and threshold points corresponding thereto may be present.

A method of finding the threshold point described above may include calculating a value corresponding to a maximum Lyapunov exponent in a nonlinear dynamical system while the level of the nonlinearity is increased. For example, like some example embodiments, when a chaotic mode is implemented by applying an alternating magnetic field to a skyrmion included in the chaotic logic device 111, a point at which the maximum Lyapunov exponent of a skyrmion behavior becomes a positive number while the strength of the alternating magnetic field is increased may be or may correspond to the above-described threshold point. In some example embodiments, the threshold point described above may be calculated through a formula and/or may be obtained through a simulation. The method for detecting the threshold point described above is a partial example, and the scope of example embodiments is not limited thereto. In some example embodiments, because various noises are present in a real physical world, the actual threshold point may be smaller than the threshold point obtained through the formula or simulation as described above.

As described above, when the threshold point for the chaotic logic device 111 is determined, the chaotic logic device 111 may operate in the chaotic mode by driving the chaotic logic device 111 in a system having the above-described threshold point or higher. For example, the chaotic mode excitation unit 114 may generate the chaos signal EXC having strength equal to or greater than the above-described threshold point, and may apply the generated chaos signal EXC to the chaotic logic device 111. Accordingly, the chaotic logic device 111 may operate in the chaotic mode.

In some example embodiments, the above-described threshold point may be lowered by adding impurities to a magnetic thin film (e.g., the chaotic logic device) in which the skyrmion is generated. Alternatively or additionally, the above-described threshold point may be lowered by asymmetrically forming the magnetic thin film such as an ellipse or a circle of which one side is cut off. In this case, the chaotic logic device 111 may operate in the chaotic mode in a magnetic field having relatively small strength. In some example embodiments, as described above, the threshold point may be obtained in advance through the formula and/or through simulation.

In some example embodiments, to describe an operation of the chaotic mode excitation unit 114, it is described that the chaotic logic device 111 includes a skyrmion. However, the scope of the example embodiments is not limited thereto. For example, the chaotic logic device 111 may include spin solitons having various other shapes or structures.

The output value measuring unit 115 may measure an output value OUT from the chaotic logic device 111 and then may output output data DT_out based on the measured output value OUT. For example, the output value OUT may indicate at least one of various physical quantities, which are generated or formed as the chaotic logic device 111 operates in the chaotic mode, such as a change in magnetic resistance (e.g., GMR, TMR, or the like), an induced current, or a change in magnetic flux, or changes thereof. In some example embodiments, even when the input value IN is the same, the output value OUT may be different depending on an initial state of the chaotic logic device 111. The output value measuring unit 115 may measure the output value OUT as described above from the chaotic logic device 111 and then may output output data DT_out based on the measured output value OUT. In some example embodiments, the output data DT_out may correspond to the result of the target logical operation LOG_t for input data.

As described above, the chaotic computer 110 may set the initial state of the chaotic logic device 111 corresponding to a target logical operation, and may apply the input value IN to the chaotic logic device 111 based on the input data DT_in, and may apply the chaos signal EXC to the chaotic logic device 111. In this case, the chaos signal EXC may have strength greater than or equal to a threshold point such that the chaotic logic device 111 is capable of operating in the chaotic mode. In this case, the output value OUT generated from the chaotic logic device 111 may correspond to a result of a target logical operation on the input data DT_in. Accordingly, various logical operations may be performed by using a single device.

Some example embodiments in which the input value IN and the chaos signal EXC are individually controlled or generated is described with reference to FIG. 3A. However, the scope of the present disclosure is not limited thereto. For example, referring to FIGS. 2 and 3B, a chaotic computer 110B may include the chaotic logic device 111, the initial state setup unit 112, an input value setup unit 113B, a chaotic mode excitation unit 114B, and the output value measuring unit 115. The chaotic logic device 111, the initial state setup unit 112, and the output value measuring unit 115 are described above, and thus, a detailed description thereof is omitted to avoid redundancy.

The input value IN generated by the input value setup unit 113B may be provided to the chaotic mode excitation unit 114B. The chaotic mode excitation unit 114B may generate an input chaos signal EXC_IN based on the input value IN and the chaotic mode. As described above, the input chaos signal EXC_IN may have strength equal to or greater than a threshold point such that the chaotic logic device 111 is capable of operating in the chaotic mode. Furthermore, the input chaos signal EXC_IN may have strength corresponding to the input data DT_in. For example, when the input data DT_in has a value of [1,1], the input chaos signal EXC_IN may be or may correspond to an alternating magnetic field having the strength of 43 mT and a frequency of 21 GHz. Alternatively, when the input data DT_in has a value of [1,0], the input chaos signal EXC_IN may be or may correspond to an alternating magnetic field having the strength of 44 mT and a frequency of 21 GHz. For example, the input chaos signal EXC_IN may have a specific frequency and sufficient strength such that the chaotic logic device 111 operates in the chaotic mode. Some strength and/or a frequency of the input chaos signal EXC_IN may be varied such that the input data DT_in is capable of being expressed. When the input chaos signal EXC_IN is applied to the chaotic logic device 111, the chaotic logic device 111 may operate in the chaotic mode similarly to that previously described. Accordingly, a detailed description thereof is omitted to avoid redundancy.

Figure 4A:
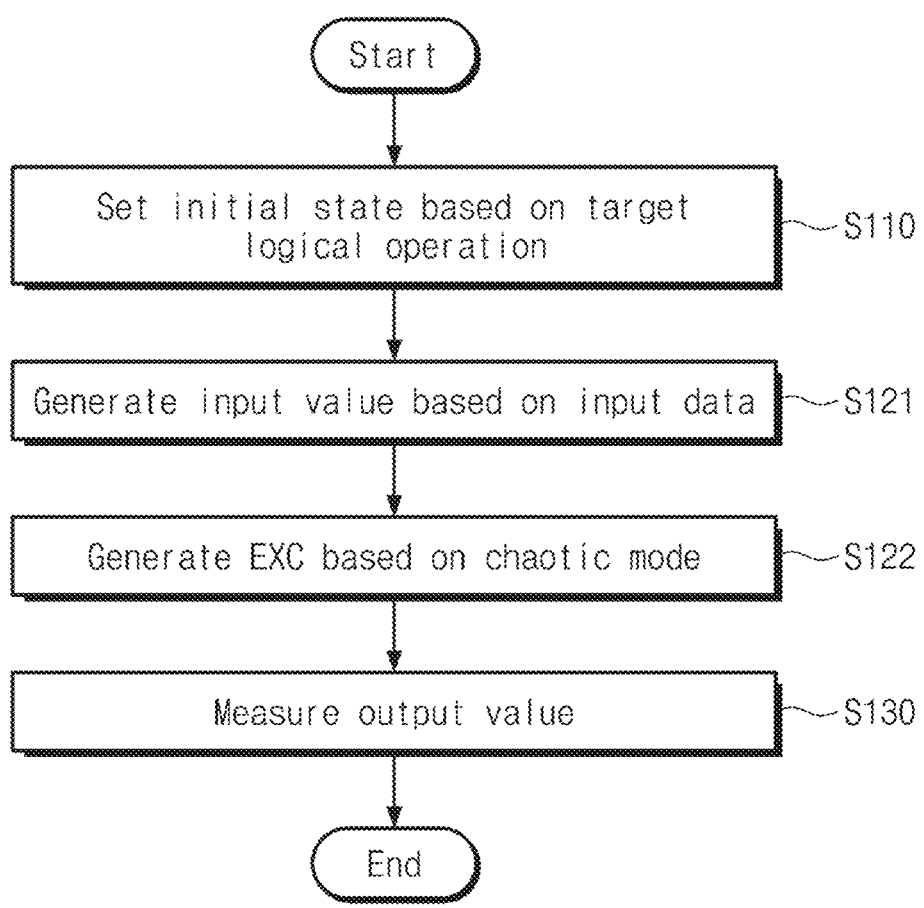
FIGS. 4A and 4B are flowcharts showing an operation of the chaotic computer of FIGS. 3A and 3B.
Figure 4B:
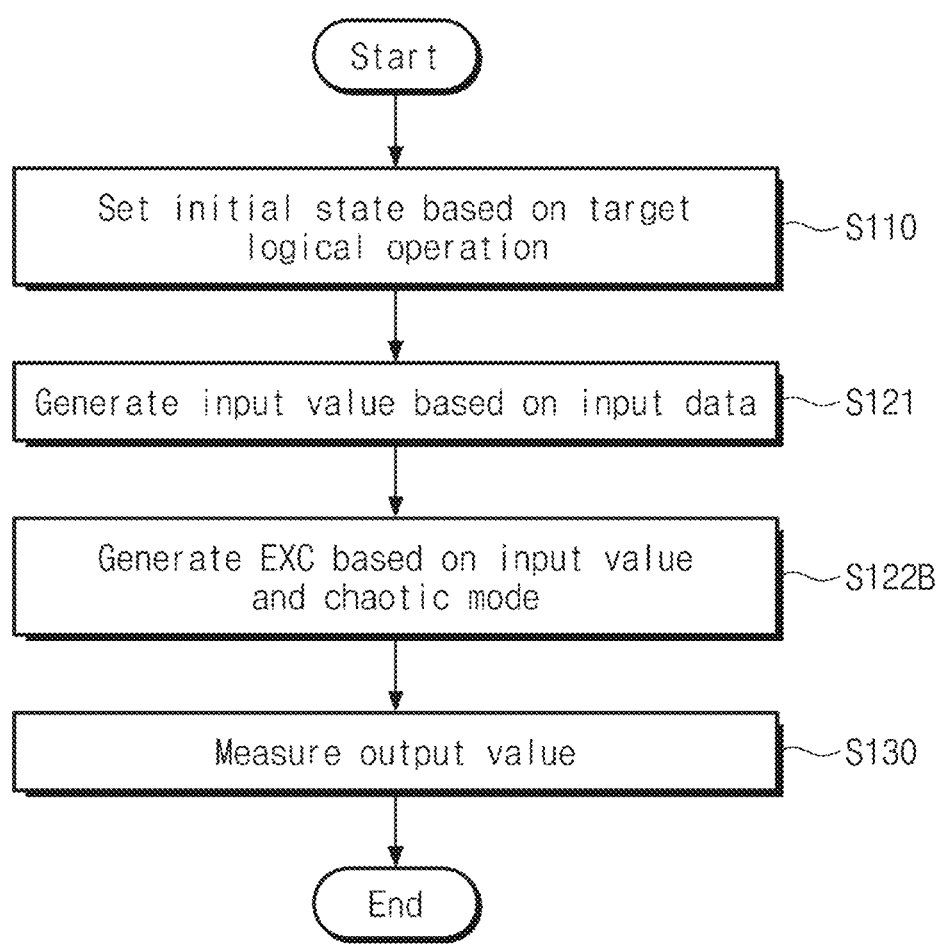

FIGS. 4A and 4B are flowcharts showing an operation of the chaotic computer of FIGS. 3A and 3B. An operating method of the chaotic computer 110 of FIG. 3A is described with reference to FIG. 4A. An operating method of the chaotic computer 110B of FIG. 3B is described with reference to FIG. 4B. Referring to FIGS. 3A and 4A, in operation S110, the chaotic computer 110 may set an initial state for the chaotic logic device 111 based on a target logical operation. For example, the chaotic logic device 111 may have various dynamic patterns depending on the initial state. For example, the initial state may be determined by changing the location of a central spin of a spin soliton (e.g., a skyrmion) included in the chaotic logic device 111 and/or the shape (e.g., one or more of the diameter of the spin soliton, the flatness of the spin soliton, or the like) of the spin soliton. The initial state setup unit 112 of the chaotic computer 110 may apply a static magnetic field to the chaotic logic device 111 such that the chaotic logic device 111 has an initial state corresponding to the target logical operation LOG_t. Information of the target logical operation LOG_t may be received from the controller 120.

As a more detailed example, within the same plane as the spin soliton of the chaotic logic device 111, the initial state setup unit 112 may apply a first initial value (e.g., a magnetic field Hx in the first direction) according to a first direction and a second initial value (e.g., a magnetic field Hy in the second direction) according to a second direction perpendicular to the first direction. The location of the central spin of the spin soliton included in the chaotic logic device 111 may be changed by the first and second initial values. In some example embodiments, the central spin location of the spin soliton may be determined by the first and second initial values.

Alternatively or additionally, the initial state setup unit 112 may apply a third initial value (e.g., a magnetic field Hz in the third direction) according to a third direction perpendicular to the same plane as the spin soliton of the chaotic logic device 111. The shape (e.g., one or more of the radius, flatness, or the like) of the spin soliton included in the chaotic logic device 111 may be changed depending on the third initial value. In some example embodiments, the shape of the spin soliton may be determined by the strength of the magnetic field of the third initial state. In some example embodiments, it is described that initial values set by the initial state setup unit 112 are static magnetic fields. However, the scope of example embodiments is not limited thereto. For example, the initial values may be replaced by various physical quantities such as one or more of an electrostatic field, an alternating electric field, a direct current, an alternating current, or an alternating magnetic field.

As described above, as the central spin location or the shape of a spin soliton is changed by the initial state setup unit 112, the initial state of the chaotic logic device 111 is changed and/or set.

In operation S121, the chaotic computer 110 may generate the input value IN based on the input data DT_in. For example, the input value setup unit 113 of the chaotic computer 110 may receive the input data DT_in from the controller 120. The input data DT_in may indicate data on which a target logical operation is performed by the chaotic computer 110 or the chaotic logic device 111. For convenience of description, it is assumed that the input data DT_in is 2-bit data. For example, the input data DT_in may have a value of [1,1], [1,0], [0,1], or [0,0]. For example, it is assumed that the chaotic logic device 111 performs a 2-input logical operation.

The input value setup unit 113 may control the magnetic field in the first direction based on the first bit of the input data DT_in, and may control the magnetic field in the second direction based on the second bit of the input data DT_in. As a more detailed example, when the input data DT_in is [1,1], the input value setup unit 113 may apply a first magnetic field (e.g., Hx) in the first direction, and may apply a second magnetic field (e.g., Hy) in the second direction. When the input data DT_in is [1,0], the input value setup unit 113 may apply the first magnetic field (e.g., Hx) in the first direction. When the input data DT_in is [0,1], the input value setup unit 113 may apply the second magnetic field (e.g., Hy) in the second direction. When the input data DT_in is [0,0], the input value setup unit 113 may not apply a magnetic field.

Alternatively or additionally, the input value setup unit 113 may apply a magnetic field having first strength in the first direction based on the first bit of the input data DT_in, and may apply a magnetic field having second strength in the first direction based on the second bit of the input data DT_in. As a more detailed example, when the input data DT_in has a bit value of [1,1], the input value setup unit 113 may apply a magnetic field corresponding to the sum of the first strength and the second strength in the first direction. When the input data DT_in has a bit value of [1,0], the input value setup unit 113 may apply a magnetic field corresponding to the first strength in the first direction. When the input data DT_in has a bit value of [0,1], the input value setup unit 113 may apply a magnetic field corresponding to the second strength in the first direction. When the input data DT_in has a bit value of [0,0], the input value setup unit 113 may not apply a magnetic field in the first direction.

The above-described input value (e.g., a magnetic field) generating method based on the input data DT_in is only an example, and the scope of example embodiments is not limited thereto. For example, the chaotic logic device 111 may support a logical operation on multi-inputs. In this case, the input data DT_in may include a plurality of bits. In this case, with respect to each of the plurality of bits of the input data DT_in, the input value setup unit 113 may be configured to generate an individual magnetic field (i.e., a distinguishable magnetic field based on a direction and strength).

In operation S122, the chaotic computer 110 may generate the chaos signal EXC based on the chaotic mode. For example, the chaotic mode excitation unit 114 of the chaotic computer 110 may include information about a threshold point at which the chaotic logic device 111 operates in a chaotic mode. The chaotic mode excitation unit 114 may control the frequency and strength of the chaos signal EXC such that the chaotic logic device 111 operates in the chaotic mode (or such that a chaotic behavior occurs).

In some example embodiments, it is described that the chaos signal EXC corresponds to an alternating magnetic field, but the scope of the present disclosure is not limited thereto. The chaos signal EXC may include at least one of various physical quantities (e.g., an alternating magnetic field, a linear alternating magnetic field, a circular alternating magnetic field, an alternating current, a perpendicular current (to a thin film), and a spin current) for driving a spin soliton.

In operation S130, the chaotic computer 110 may measure an output value from the chaotic logic device 111. For example, the physical quantities (e.g., the input value IN and the chaos signal EXC) generated through operation S121 and operation S122 may be provided to the chaotic logic device 111. Accordingly, the chaotic logic device 111 may operate in the chaotic mode. When the chaotic logic device 111 operates in the chaotic mode, the output value OUT generated by the chaotic logic device 111 may have a specific pattern. The output value measuring unit 115 of the chaotic computer 110 may detect or measure a specific pattern of the output value OUT generated by the chaotic logic device 111 and then may generate output data based on the measured output value OUT. In some example embodiments, the output value OUT may include at least one of various physical quantities such as a change in a magnetic field, reversal of a central spin, a change in a speed of the central spin, a change in magnetic resistance, and the like, which are formed or generated by the chaotic mode of the chaotic logic device 111.

In some example embodiments, the specific pattern of the output value OUT may correspond to an input value and an initial state. In this case, it is assumed that the input value is the same, the output value OUT may vary depending on the initial state of the chaotic logic device 111. Alternatively, when it is assumed that the initial state of the chaotic logic device 111 is the same, the output value OUT may vary depending on the input value IN. This may indicate that the various logical operations may be performed on input data depending on the initial state of the chaotic logic device 111. Accordingly, the various logical operations (e.g., seven basic logical operations and/or complex logical operations described with reference to FIG. 1) may be performed by using the chaotic logic device 111 (i.e., a single device).

Next, referring to FIGS. 3B and 4B, the chaotic computer 110B may perform operation S110, operation S121, operation S122B, and operation S130. Operation S110, operation S121, and operation S130 are similar to those described with reference to FIG. 4A, and thus, a detailed description thereof is omitted to avoid redundancy.

In operation S122B, the chaotic computer 110B may generate the input chaos signal EXC_IN based on the input value IN and the chaotic mode. The input chaos signal EXC_IN may have strength equal to or greater than a threshold point such that the chaotic logic device 111 is capable of operating in the chaotic mode. Furthermore, the input chaos signal EXC_IN may have strength corresponding to the input data DT_in. The generated input chaos signal EXC_IN may be applied to the chaotic logic device 111. The remaining operations or configurations are similar to those described above except that the input chaos signal EXC_IN obtained by reflecting the input value IN is applied to the chaotic logic device 111, and thus a detailed description thereof is omitted to avoid redundancy.

Hereinafter, to more easily describe, some embodiments will be described based on the chaotic computer 110 of FIG. 3A. However, the scope of example embodiments is not limited thereto. For example, it may be understood that the chaotic computer may be implemented through the structure of FIG. 3B, other various methods, or other various structures.

Figure 5:
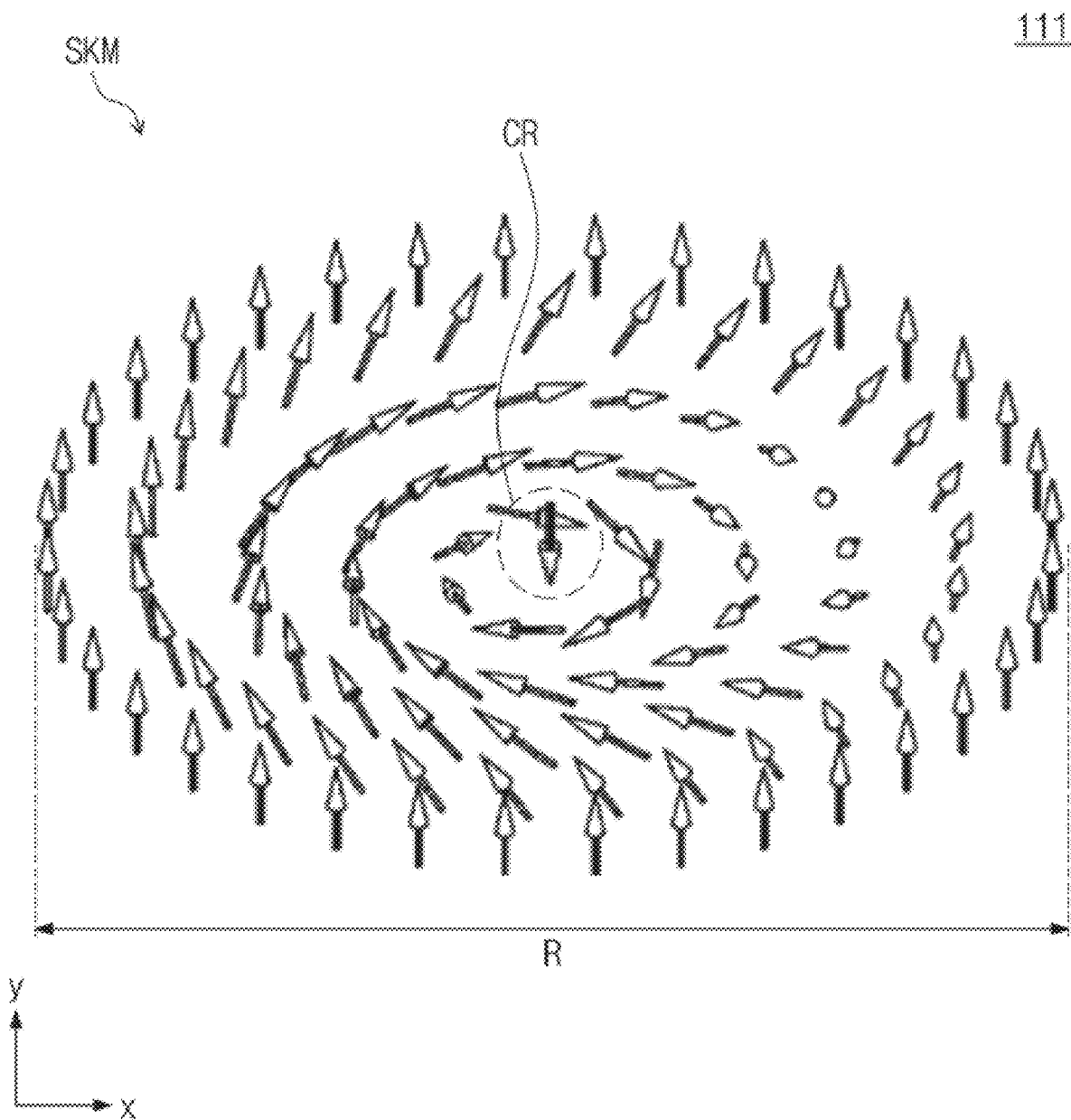
FIG. 5 is a view illustrating a skyrmion that is a kind of spin soliton included in the chaotic logic device of FIG. 3A.

FIG. 5 is a view illustrating a skyrmion that is a kind of spin soliton included in the chaotic logic device of FIG. 3A. Referring to FIGS. 3A and 5, the chaotic logic device 111 may include a spin soliton formed on a plane defined by a first and second axis such as by an x-axis and a y-axis. As an example of a spin soliton, a skyrmion SKM as shown in FIG. 5 is present.

The skyrmion SKM may be or may include or be included in a spin structure having a shape of a vortex, and may refer to a structure in which a central spin CR and a peripheral spin of the skyrmion have anti-parallel states, and spins between the central spin and the peripheral spin are arranged in the shape of a vortex. As shown in FIG. 5, a structure in which magnetization around the central spin rotates in a clockwise (or counterclockwise) direction is referred to as a "bloch-type skyrmion (or a spiral skyrmion)", and a structure in which magnetization around the core appears radially is referred as to a "neel-type skyrmion (or a hedgehog skyrmion)".

The type of a skyrmion may be determined depending on the mechanism by which a Dzyaloshinskii-Moriya interaction (DMI) is formed. The bloch-type skyrmion may be formed by a crystal structure, and the neel-type skyrmion may be formed by an interface. There is a central spin (or the core CR) having a magnetization direction perpendicular to the peripheral spin at the center of the skyrmion structure. This structure has stability with topological singularity. A radius 'R' of the skyrmion SKM may be quite small (e.g., several to tens of nanometers (nm)), and the skyrmion SKM may have properties of a stable particle. Accordingly, the skyrmion SKM may be applied to highly integrated operating devices and magnetic memory devices by using or controlling the physical characteristics and topological singularities of the skyrmion SKM.

As described below, when the chaotic logic device 111 operates in a chaotic mode and/or a chaotic behavior occurs, the shape and/or physical characteristics of the skyrmion SKM may vary depending on the location and radius 'R' of the central spin (and/or the core CR) of the spin soliton (e.g., the skyrmion SKM in FIG. 5) included in the chaotic logic device 111. For example, the location and/or radius 'R' of the central spin CR of the skyrmion SKM in FIG. 5 may correspond to an initial state related to the target logical operation LOG_t of the chaotic logic device 111.

However, the scope of example embodiments is not limited thereto. For example, the skyrmion SKM in FIG. 5 is a partial example of a topology soliton or a spin soliton included in the chaotic logic device 111 according to. The topology soliton or spin soliton may further include various shapes having spin structures such as one or more of vortex, skyrmionium, anti-skyrmion, and meron.

Figure 6:
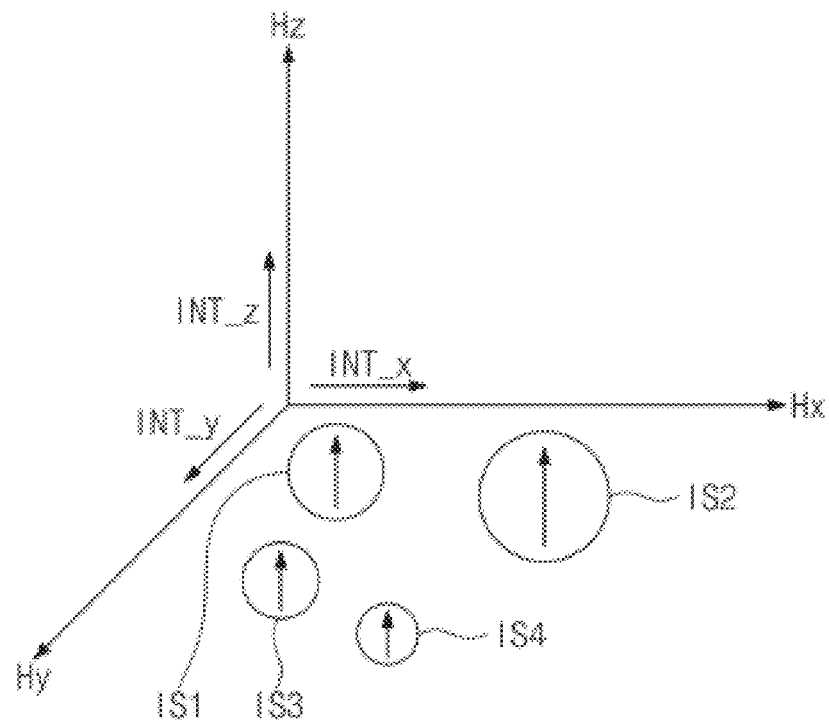
FIG. 6 is a diagram for describing an operation of the initial state setup unit of FIG. 3A.

FIG. 6 is a diagram for describing an operation of the initial state setup unit of FIG. 3A. For the sake of brevity and for ease of description, the skyrmion SKM included in the chaotic logic device 111 is schematically shown. The horizontal axis Hx, horizontal axis Hy, and vertical axis Hz in FIG. 6 indicate the first horizontal axis, second horizontal axis, and vertical axis of a system in which the chaotic logic device 111 is positioned, respectively.

Referring to FIGS. 3A, 5, and 6, the spin soliton included in the chaotic logic device 111 may be transformed into various shapes based on initial inputs (e.g., INT_x, INT_y, INT_z) input by the initial state setup unit 112. For example, on the same plane as the spin soliton, the central spin CR of the spin soliton may move (e.g., a location is changed) depending on the applied input values (e.g., INT_x, which is the magnetic field Hx in the x-axis direction, and INT_y, which is the magnetic field Hy in the y-axis direction). Alternatively or additionally, the radius 'R' of the spin soliton may be changed by an input value (e.g., INT_z, which is the magnetic field Hz in the z-axis direction) applied in a direction perpendicular to the same plane as the spin soliton.

Accordingly, the spin soliton may be set to one initial state among a plurality of initial states IS1 to IS4 as shown in FIG. 6. The central spins CR of the plurality of initial states IS1 to IS4 may be positioned at different locations, and the radius 'R' of each of the central spins CR may be different. For example, the spin soliton included in the chaotic logic device 111 may have one initial state among the plurality of initial states IS1 to IS4 depending on the initial inputs (e.g., INT_x, INT_y, and INT_z) entered by the initial state setup unit 112.

In some example embodiments, the plurality of initial states IS1 to IS4 may correspond to different logical operations, respectively. For example, when the spin soliton of the chaotic logic device 111 operates in a chaotic mode, different physical characteristics may appear depending on the plurality of initial states IS1 to IS4. For example, even when the same input value is applied to the spin soliton of the chaotic logic device 111, physical characteristics expressed depending on the plurality of initial states IS1 to IS4 may be different from one another. This may indicate that the plurality of initial states IS1 to IS4 output different result values with respect to the same input. For example, the plurality of initial states IS1 to IS4 may correspond to different logical operations, respectively.

Figure 7:
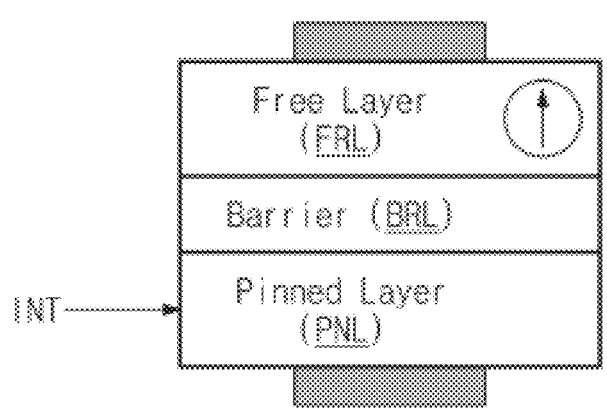
FIG. 7 is a diagram for describing an operation of the initial state setup unit of FIG. 3A.

FIG. 7 is a diagram for describing an operation of the initial state setup unit of FIG. 3A. In some example embodiments, the chaotic logic device 111 may be composed of materials of various shapes. As an example, as shown in FIG. 7, the chaotic logic device 111 may be implemented as a magnetic tunnel junction device MTJ. The magnetic tunnel junction device MTJ may include a free layer FRL, a barrier layer BRL, and a pinned layer PNL.

The free layer FRL may include a material which has a variable magnetization direction. The magnetization direction of the free layer FRL may be changed by an electrical/magnetic factor provided from the outside and/or the inside. The free layer FRL may include a ferromagnetic material that includes at least one of cobalt (Co), iron (Fe), and nickel (Ni). For example, the free layer FRL may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. However, the scope of example embodiments is not limited thereto.

The barrier layer BRL may be interposed between the free layer FRL and the pinned layer PNL. A thickness of the barrier layer BRL may be smaller than a spin diffusion distance. The barrier layer BRL may include a non-magnetic material. For example, the barrier layer BRL may include at least one selected from oxide of magnesium (Mg), titanium (Ti), aluminum (Al), magnesium-zinc (MgZn) and magnesium-boron (MgB), and nitride of titanium (Ti) and vanadium (V). However, the scope of example embodiments is not limited thereto.

The magnetization direction of the pinned layer PNL may be fixed to a specific direction. The pinned layer PNL may include a ferromagnetic material. For example, the pinned layer PNL may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

In some example embodiments, the magnetic tunnel junction device MTJ may further include an anti-ferromagnetic layer for fixing the magnetization direction of the pinned layer PNL. In this case, the pinned layer PNL may have a magnetization direction fixed by the anti-ferromagnetic layer. In some example embodiments, the anti-ferromagnetic layer may include an anti-ferromagnetic material. The anti-ferromagnetic layer may include at least one selected from PtMn, IrMn, MnO, MnS, MnTe, MnF2, FeCl2, FeO, CoCl2, CoO, NiCl2, NiO, and Cr. However, the scope of example embodiments is not limited thereto.

In some example embodiments, the spin soliton according to some example embodiments may be formed on or at least partly on the free layer FRL. The initial value INT may indicate an electric signal or a magnetic signal for changing the magnetization value of the pinned layer PNL. When the magnetization value of the pinned layer PNL is slightly changed by the initial value INT, the degree of coupling between the free layer FRL and the pinned layer PNL may be changed. Accordingly, the initial state of the spin soliton included in the free layer FRL may be changed or set.

The chaotic logic device 111 may be or may include a variety of spin oscillators obtained by applying the magnetic tunnel junction device MTJ. For example, one or more of a spin-torque nano oscillator STNO using spin-transfer torque (STT) or spin-orbit torque, a spin-hall nano oscillator SHNO, a voltage-controlled magnetic anisotropy (VCMA) device, and a racetrack device may be present.

Figure 8A:
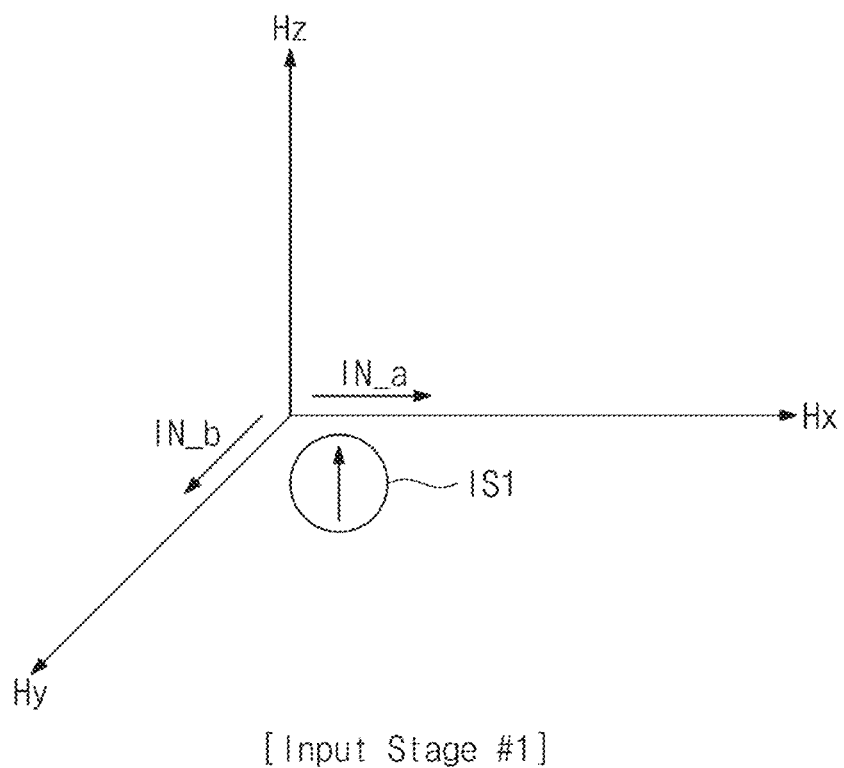
FIGS. 8A and 8B are diagrams for describing an operation of the input value setup unit of FIG. 3A.
Figure 8B:
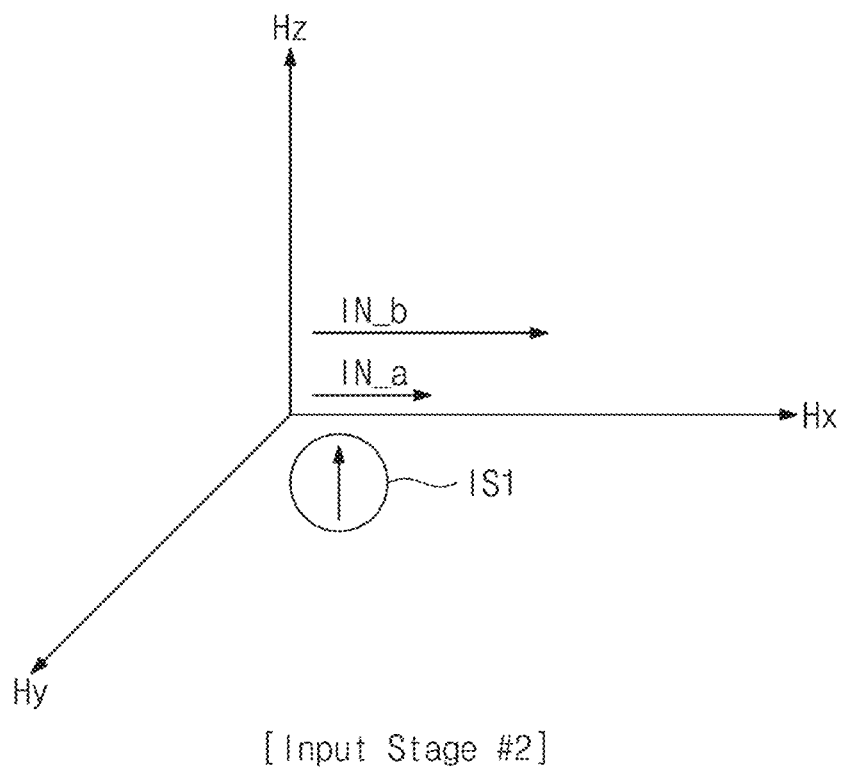

FIGS. 8A and 8B are diagrams for describing an operation of the input value setup unit of FIG. 3A. The diagrams of FIGS. 8A and 8B indicate magnetic fields of space where a spin soliton of the chaotic logic device 111 is formed. A first horizontal axis may indicate Hx of a magnetic field; a second horizontal axis may indicate Hy of the magnetic field; and a vertical axis may indicate Hz of the magnetic field.

Referring to FIGS. 3A, 8A, and 8B, the input value setup unit 113 may set the input value IN based on the input data DT_in. For example, it is assumed that the input data DT_in is 2-bit data. In this case, as shown in FIG. 8A, the input value setup unit 113 may generate a first input value IN_a by controlling the strength of a magnetic field (i.e., Hx) in a first direction based on the first bit of the input data DT_in. The input value setup unit 113 may generate a second input value IN_b by controlling the strength of a magnetic field (i.e., Hy) in a second direction based on the second bit of the input data DT_in.

Alternatively, as shown in FIG. 8B, the input value setup unit 113 may generate the first input value IN_a by controlling the strength of the magnetic field (e.g., Hx) in the first direction based on the first bit of the input data DT_in. The input value setup unit 113 may generate the second input value IN_b by controlling the strength of the magnetic field (e.g., Hz) in the first direction based on the second bit of the input data DT_in. In this case, a magnitude of the first input value IN_a may be different from a magnitude of the second input value IN_b.

The above-described input value generating method is a partial example of the present disclosure, and the scope of the present disclosure is not limited thereto. For example, the input data DT_in may include a plurality of bits. Input values corresponding to each of the plurality of bits may have different directions or different magnitudes such that the input values are capable of being distinguished from each other.

Figure 9A:
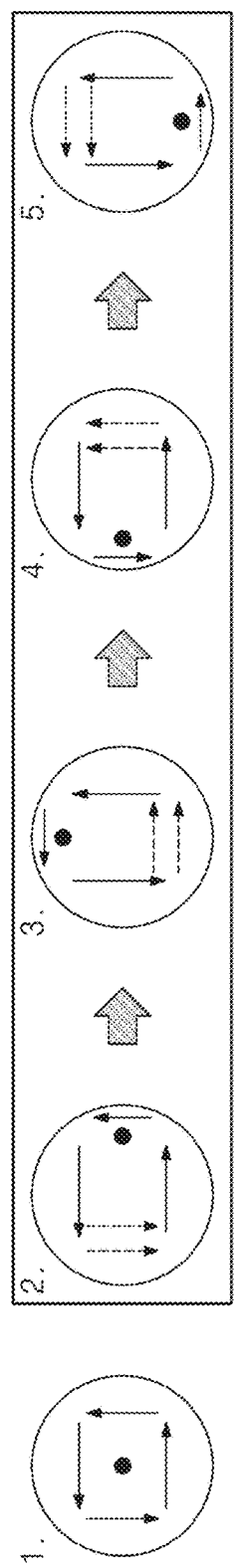
FIGS. 9A and 9B are diagrams for describing output values generated when a chaotic logic device of FIG. 3A operates in a chaotic mode.
Figure 9B:
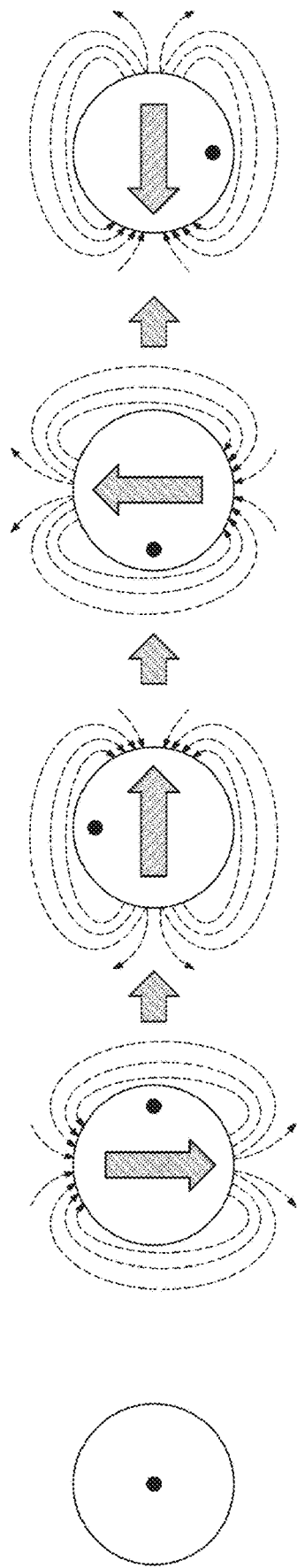

FIGS. 9A and 9B are diagrams for describing output values generated when a chaotic logic device of FIG. 3A operates in a chaotic mode. Referring to FIGS. 3A, 9A, and 9B, as the input value is applied to the chaotic logic device 111, the chaotic logic device 111 may operate in a chaotic mode. In this case, in a spin soliton included in the chaotic logic device 111, the central spin CR may rotate, or the magnetization of the central spin CR may change. Accordingly, physical characteristics or physical patterns of the chaotic logic device 111 may be changed.

For example, as shown in FIGS. 9A and 9B, when the central spin CR is positioned at the center of the spin soliton structure, the surrounding magnetization may rotate in a counterclockwise direction. In this case, the magnitude of the surrounding magnetization may be uniform. In this case, as shown in FIG. 9A, as the chaotic logic device 111 operates in the chaotic mode, the central spin CR may rotate. Accordingly, the magnitude of the surrounding magnetization may change. The output value OUT may be measured by detecting a change in the magnitude of the surrounding magnetization. In some example embodiments, when the change in the magnitude of the surrounding magnetization exceeds a reference value, the output data DT_out may be determined as bit 1. Otherwise, the output data DT_out may be determined as bit 0.

Alternatively, as shown in FIG. 9B, as the chaotic logic device 111 operates in the chaotic mode, the central spin CR may rotate. Accordingly, the direction of the surrounding magnetization may be changed or rotate. The output value OUT may be measured by detecting the direction change or rotation of the surrounding magnetization. The above-described operation of the chaotic logic device 111 is a partial example, and the scope of the present disclosure is not limited thereto.

Figure 10A:
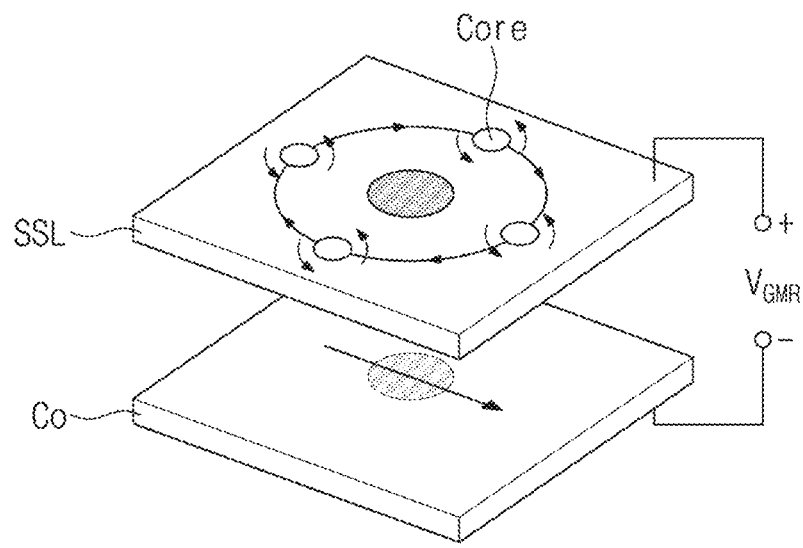
FIGS. 10A and 10B are diagrams for describing a method of measuring an output value of a chaotic logic device of FIG. 3A.
Figure 10B:
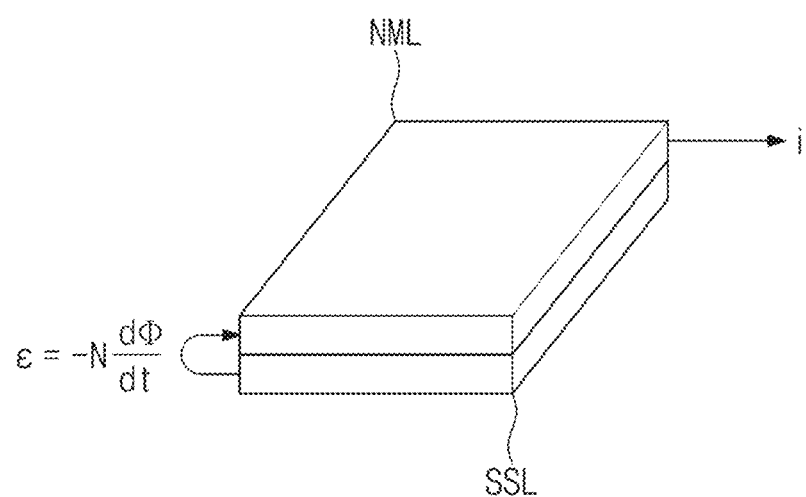

FIGS. 10A and 10B are diagrams for describing a method of measuring an output value of a chaotic logic device of FIG. 3A. As shown in FIG. 10A, the chaotic logic device 111 may include a spin soliton layer SSL and a metal layer Co. In some example embodiments, the spin soliton layer SSL may form a spin soliton. As the central spin of spin soliton rotates, magnetic resistance between the spin soliton layer SSL and the metal layer Co may change. The magnetic resistance between the spin soliton layer SSL and the metal layer Co may be measured by applying a voltage VGMR between the spin soliton layer SSL and the metal layer Co. A change amount in magnetic resistance may correspond to the output value OUT of the chaotic logic device 111 according to some example embodiments.

Alternatively, as shown in FIG. 10B, the chaotic logic device 111 may include the spin soliton layer SSL and a non-magnetized layer NML. A spin soliton may be formed in the spin soliton layer SSL. As described above, a magnetic field may change through the chaotic mode. As shown in FIG. 10B, this magnetic field change may generate an induced current 'i' through the non-magnetized layer NML. As the induced current 'i' is measured, the output value OUT of the chaotic logic device 111 may be measured.

A method of measuring the output value OUT of the chaotic logic device 111 as described above is a partial example, and the scope of the present disclosure is not limited thereto. In a spin soliton structure of the chaotic logic device 111, the output value measuring method according to some example embodiments may include a method of detecting various patterns or various physical characteristics generated through a chaotic mode.

Figure 11:
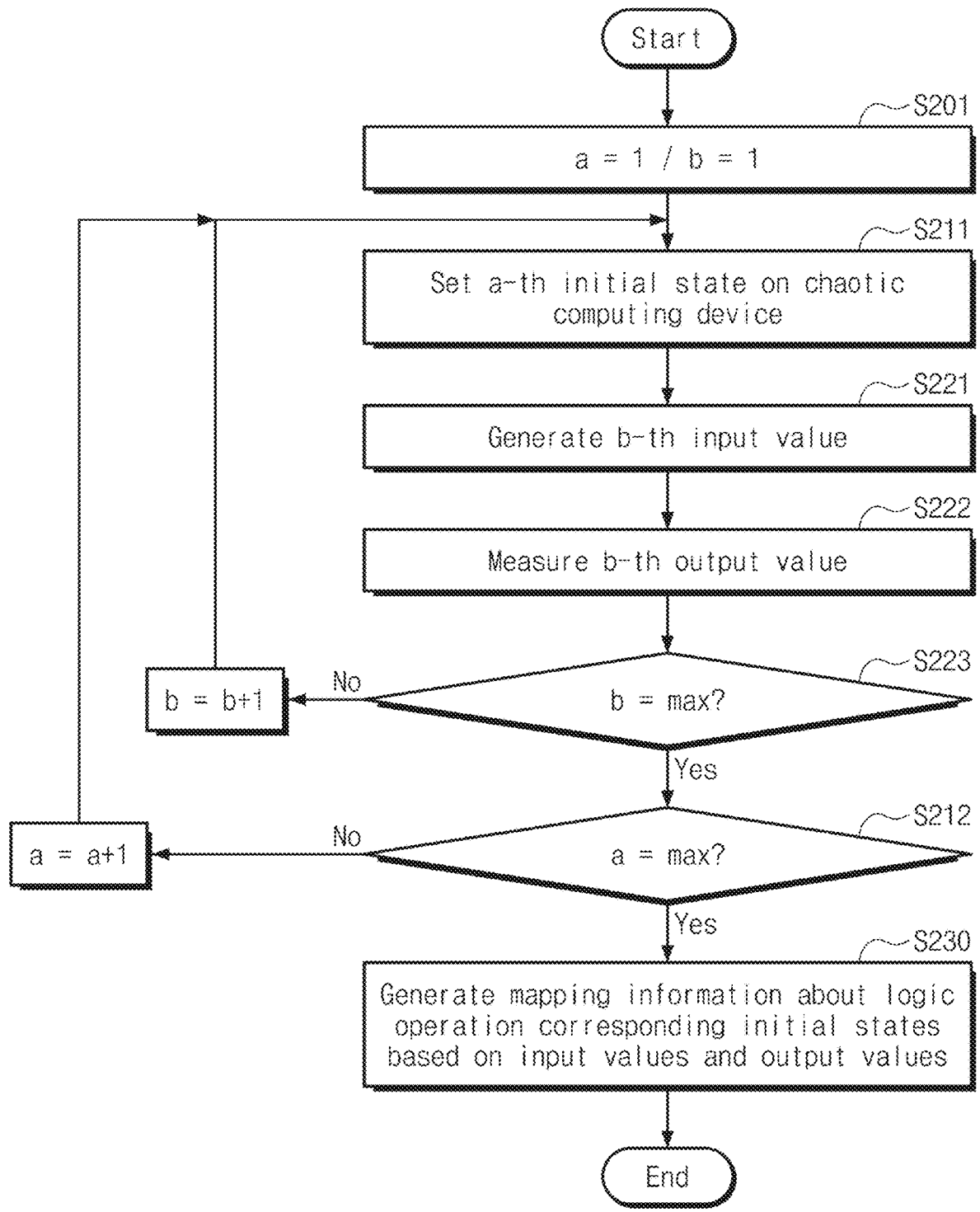
FIG. 11 is a flowchart illustrating an operation of setting a mapping relationship between target logical operations according to an initial state of a chaotic logic device of FIG. 3A.

FIG. 11 is a flowchart illustrating an operation of setting a mapping relationship between target logical operations according to an initial state of a chaotic logic device of FIG. 3A. In some example embodiments, an operation according to the flowchart of FIG. 11 may be performed and/or managed by the controller 120, and the generated mapping information may be stored in the initial state setup unit 112 of the chaotic computer 110. The initial state setup unit 112 may determine an initial state of the chaotic logic device 111 corresponding to a target logical operation based on the generated mapping information.

Referring to FIGS. 2, 3A, and 11, in operation S201, each of variables 'a' and 'b' may be initialized or set to 1. In some example embodiments, it will be understood that the variable 'a' is used to express a repetitive operation for generating mapping information about each of a plurality of initial states of the chaotic logic device 111 and has no other technical and/or functional features and may be a dummy variable or index variable otherwise. In some example embodiments, it will be understood that the variable 'b' is used to express various shapes (e.g., various combinations of bits) of input data applied to the chaotic logic device 111 and has no other technical or functional characteristics and may be a dummy variable or index variable otherwise.

In operation S211, the chaotic computer 110 may set an a-th initial state for the chaotic logic device 111. For example, the initial state setup unit 112 of the chaotic computer 110 may generate an a-th initial value for setting the chaotic logic device 111 to the a-th initial state. In some example embodiments, the a-th initial value corresponding to the a-th initial state may be a magnetic field or electric field (e.g., a voltage, a current, resistance, or the like) that allows the central spin or shape of a spin soliton of the chaotic logic device 111 to correspond to the a-th initial state. Because the initial state setting method corresponding to operation S211 is similar to that described with reference to FIG. 6, a detailed description thereof is omitted to avoid redundancy.

In operation S221, the chaotic computer 110 may generate a b-th input value. For example, when mapping information of 2-input logical operation is generated with respect to the chaotic logic device 111, input values may have four shapes: [1,1], [1,0], [0,1], and [0,0]. Under control of an external device (e.g., the controller 120 or another control device), the input value setup unit 113 may generate the b-th input value among the input values of four shapes of [1,1], [1,0], [0,1], and [0,0]. In some example embodiments, as described above, the generated b-th input value may be controlled such that the chaotic logic device 111 is capable of operating in a chaotic mode.

In operation S222, the chaotic computer 110 may measure the b-th output value. For example, in response to the b-th input value generated in operation S221, the chaotic logic device 111 may operate in the chaotic mode or may exhibit a chaotic behavior. The output value measuring unit 115 of the chaotic computer 110 may detect changes in various physical quantities generated by the chaotic logic device 111 and may measure the b-th output value based on the detected changes. In some example embodiments, the measured b-th output value may be converted into the corresponding bit value (e.g., 1 or 0).

Afterwards, in operation S223, whether the variable "b" is equal to a maximum value such a as a first maximum value may be determined. For example, as described above, when a 2-input logical operation is performed on the chaotic logic device 111, it may be determined whether all of four input values described above are input to the chaotic logic device 111. When the variable 'b' is not the maximum value (e.g., when an input value that is not logically operated is left), the variable 'b' is increased by 1, and operation S211 is performed. For example, with respect to the a-th initial state of the chaotic logic device 111, the chaotic computer 110 may sequentially apply a plurality of input values, and then may repeatedly perform a process of measuring a corresponding output value.

When the variable 'b' is the maximum value, in operation S212, it may be determined whether the variable 'a' is a maximum value such as the first maximum value or a second maximum value. For example, it may be determined whether all initial states for the chaotic logic device 111 are reflected. When there is an initial state that is not reflected in the chaotic logic device 111, the variable 'a' may be increased by 1, and operation S211 may be performed.

When the variable 'a' is the maximum value, in operation S230, the chaotic computer 110 may generate mapping information of a logical operation corresponding to an initial state based on input values and output values. For example, it is assumed that the 2-input logical operation is performed on the chaotic logic device 111. In this case, with respect to 2-input data, there may be a total of 16 types of possible logical operations. When the output values from the chaotic logic device 111 in the first initial state are measured as 0, 1, 1, and 0 with respect to the input values of [1,1], [1,0], [0,1], and [0,0], the first initial state may correspond to an XOR logical operation. Alternatively, when the output value from the chaotic logic device 111 in the second initial state are measured as 0, 1, 1, and 1 with respect to the input values of [1,1], [1,0], [0,1], and [0,0], the second initial state may correspond to a NAND logical operation.

As described above, a logical operation corresponding to each initial state is determined based on the relationship between the input values and the output values for each initial state, and mapping information may be generated based on the logical operation. The generated mapping information may be stored and managed by the chaotic computer 110 in the initial state setup unit 112.

Figure 12:
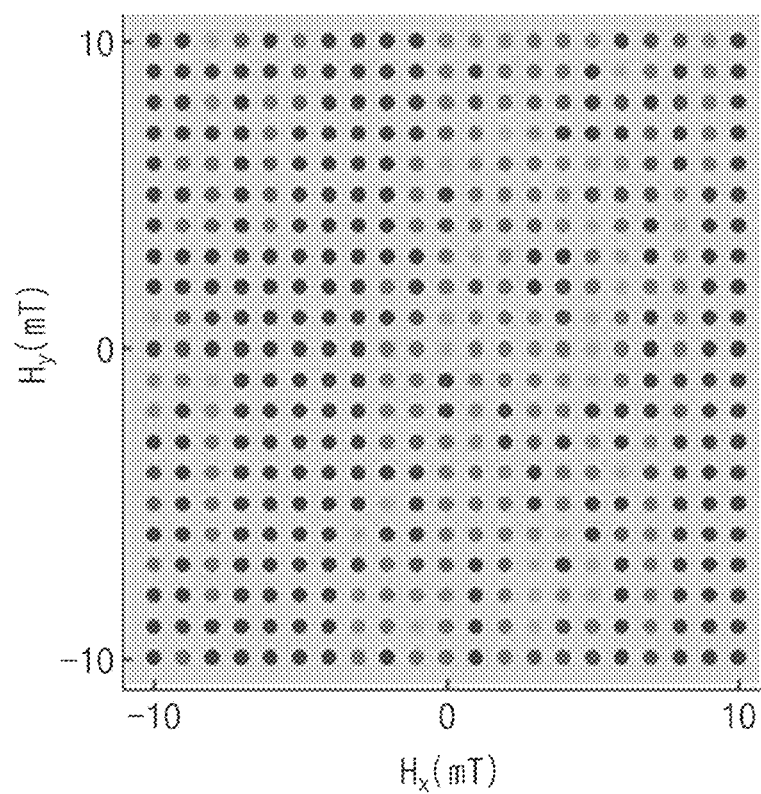
FIG. 12 is a diagram for describing initial states set depending on an operating method of FIG. 11.
Figure 13:
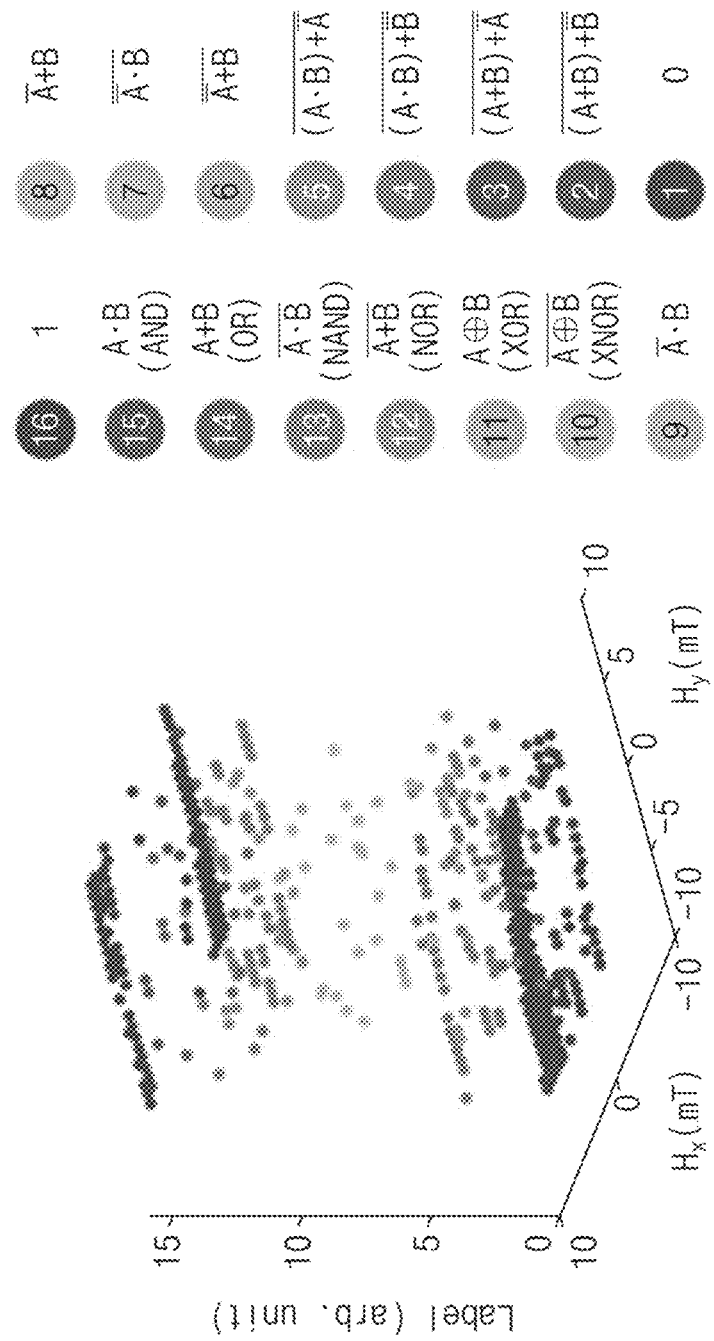
FIG. 13 is a diagram showing a result of a logical operation corresponding to an initial state diagram of FIG. 12.

FIG. 12 is a diagram for describing initial states set depending on an operating method of FIG. 11. FIG. 13 is a diagram showing a result of a logical operation corresponding to an initial state diagram of FIG. 12. The horizontal and vertical axes of graphs of FIGS. 12 and 13 indicate the strength of a magnetic field Hx on an x-axis and the strength of a magnetic field Hy on a y-axis on a plane where a spin soliton of the chaotic logic device 111 is formed, respectively. The vertical axis of the graph of FIG. 13 is an indicator for expressing an initial state according to a corresponding logical operation.

As shown in FIG. 12, an initial state of the chaotic logic device 111 may be determined by controlling the strength of each of the magnetic fields Hx and Hy of the horizontal axis and the vertical axis applied to the chaotic logic device 111. In FIG. 12, the number of initial states of the chaotic logic device 111 may be 441 in total. However, the scope of example embodiments is not limited thereto. For example, more initial states may be set by further subdividing the strength of each of the horizontal and vertical magnetic fields Hx and Hy applied to the chaotic logic device 111 or by additionally controlling a magnetic field Hz of a vertical axis.

The chaotic logic device 111 may be set to one of 441 initial states based on the graph of FIG. 12, and an input value corresponding to 2-input data may be applied. In this case, the output value measured from the chaotic logic device 111 may be determined as various patterns depending on the initial state.

As an example, as shown in FIG. 13, logical operations corresponding to 2-input data may be divided into 16 logical operations. For example, in FIGS. 12 and 13, when the chaotic logic device 111 is set to the initial states represented with a color of "1", an output value measured from the chaotic logic device 111 may correspond to 0 with respect to input values corresponding to 2-input data (A, B). When the chaotic logic device 111 is set to the initial states represented with a color of "2", an output value measured from the chaotic logic device (A+B)+B 111 may correspond to a result of a logical operation of with respect to input values corresponding to 2-input data (A, B). When the chaotic logic device 111 is set to the initial states represented with a color of "3", an output value measured from the chaotic logic device 111 may correspond to a result of a logical operation of $\overline{(A+B)+\overline{A}}$ with respect to input values corresponding to 2-input data (A, B). When the chaotic logic device 111 is set to the initial states represented with a color of "4", an output value measured from the chaotic logic device 111 may correspond to a result of a logical operation of $\overline{(A \cdot B)+\overline{B}}$ with respect to input values corresponding to 2-input data (A, B). When the chaotic logic device 111 is set to the initial states represented with a color of "5", an output value measured from the chaotic logic device 111 may correspond to a result of a logical operation of $\overline{(A \cdot B)+\overline{A}}$ with respect to input values corresponding to 2-input data (A, B). When the chaotic logic device 111 is set to the initial states represented with a color of "6", an output value measured from the chaotic logic device 111 may correspond to a result of a logical operation of $\overline{(A+B)}$ with respect to input values corresponding to 2-input data (A, B). When the chaotic logic device 111 is set to the initial states represented with a color of "7", an output value measured from the chaotic logic device 111 may correspond to a result of a logical operation of $\overline{(A \cdot B)}$ with respect to input values corresponding to 2-input data (A, B). When the chaotic logic device 111 is set to the initial states represented with a color of "8", an output value measured from the chaotic logic device 111 may correspond to a result of a logical operation of $\overline{A}+B$ with respect to input values corresponding to 2-input data (A, B). When the chaotic logic device 111 is set to the initial states represented with a color of "9", an output value measured from the chaotic logic device 111 may correspond to a result of a logical operation of $\overline{A} \cdot B$ with respect to input values corresponding to 2-input data (A, B). When the chaotic logic device 111 is set to the initial states represented with a color of "10", an output value measured from the chaotic logic device 111 may correspond to a result of a logical operation of $\overline{A \oplus B}$ with respect to input values corresponding to 2-input data (A, B). When the chaotic logic device 111 is set to the initial states represented with a color of "11", an output value measured from the chaotic logic device 111 may correspond to a result of a logical operation of $A \oplus B$ with respect to input values corresponding to 2-input data (A, B). When the chaotic logic device 111 is set to the initial states represented with a color of "12", an output value measured from the chaotic logic device 111 may correspond to a result of a logical operation of $\overline{A}+\overline{B}$ with respect to input values corresponding to 2-input data (A, B). When the chaotic logic device 111 is set to the initial states represented with a color of "13", an output value measured from the chaotic logic device 111 may correspond to a result of a logical operation of $\overline{A} \cdot \overline{B}$ with respect to input values corresponding to 2-input data (A, B). When the chaotic logic device 111 is set to the initial states represented with a color of "14", an output value measured from the chaotic logic device 111 may correspond to a result of a logical operation of $A+B$ with respect to input values corresponding to 2-input data (A, B). When the chaotic logic device 111 is set to the initial states represented with a color of "15", an output value measured from the chaotic logic device 111 may correspond to a result of a logical operation of $A \cdot B$ with respect to input values corresponding to 2-input data (A, B). When the chaotic logic device 111 is set to the initial states represented with a color of "16", an output value measured from the chaotic logic device 111 may correspond to 1 with respect to input values corresponding to 2-input data (A, B).

As described above, corresponding logical operations may be determined with respect to each initial state of the chaotic logic device 111, and mapping information may be generated based on the corresponding logical operations. The generated mapping information may be stored in the initial state setup unit 112 of the chaotic computer 110.

In some example embodiments, the initial state setup unit 112 of the chaotic computer 110 may determine or set the initial state of the chaotic logic device 111 based on the stored mapping information. For example, as described with reference to FIGS. 12 and 13, it is assumed that mapping information is set. In this case, when the chaotic computer 110 performs a logical operation of $\overline{(A \cdot B)+\overline{A}}$, the initial state setup unit 112 may set an initial state of the chaotic logic device 111 through the strength of each of the magnetic fields corresponding to the initial states represented with the color of "5". In this case, the output value measured from the chaotic logic device 111 may correspond to the result of the logical operation of $\overline{(A \cdot B)+\overline{A}}$.

Figure 14A:
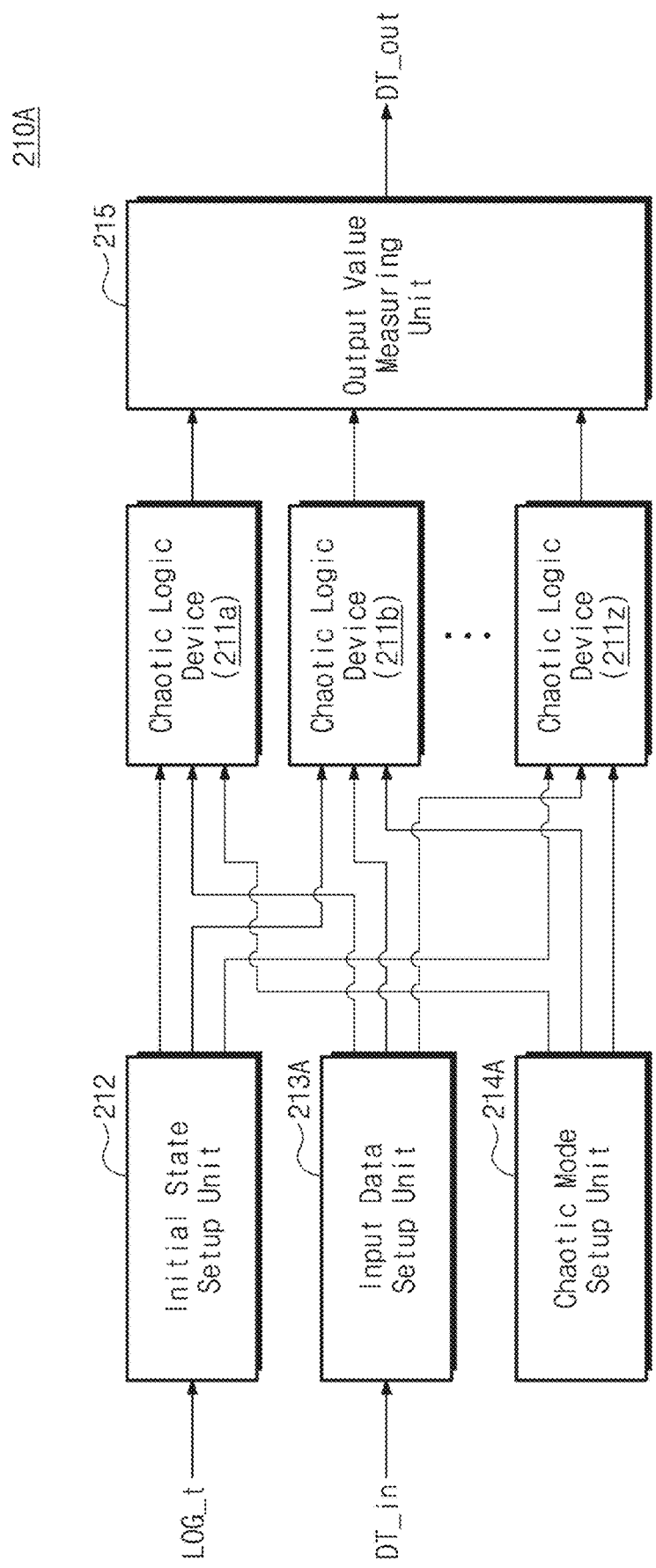
FIGS. 14A and 14B are block diagrams showing a chaotic computer, according to various example embodiments.
Figure 14B:
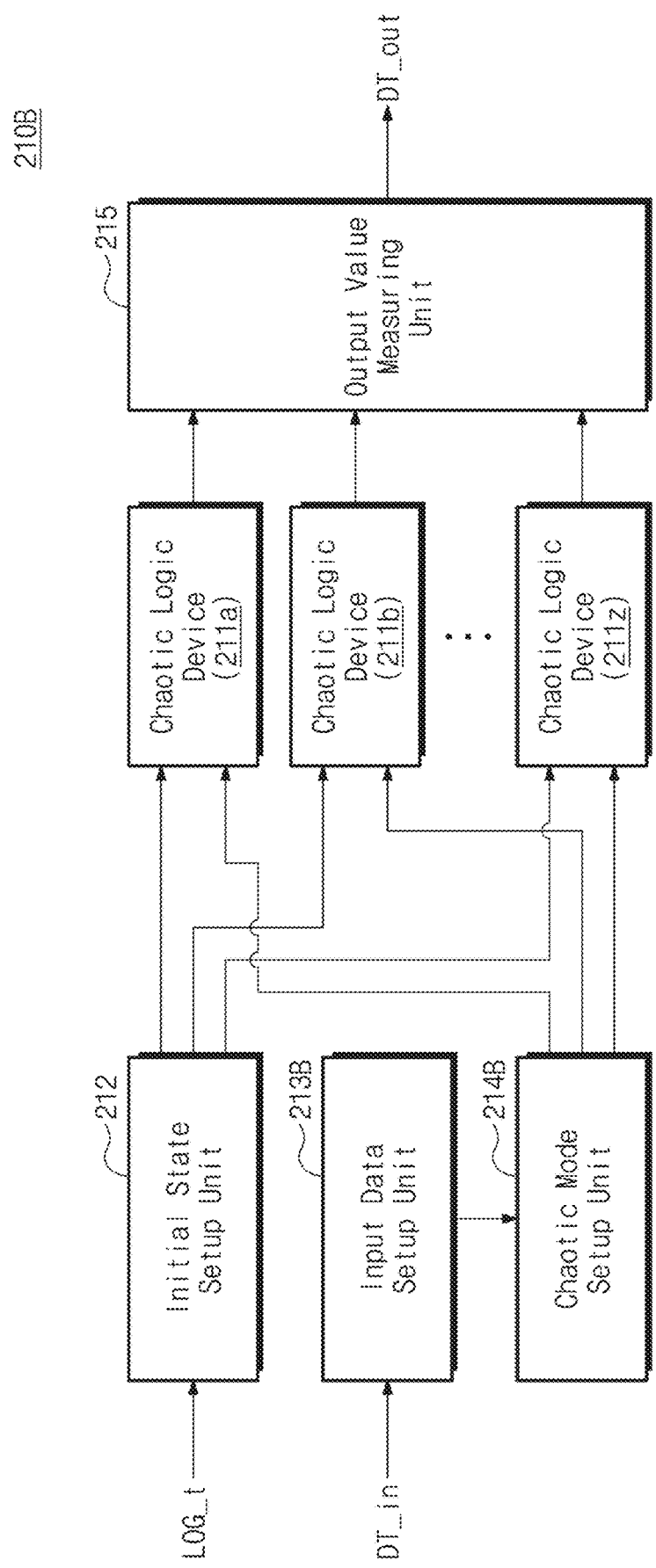

FIGS. 14A and 14B are block diagrams showing a chaotic computer, according to some example embodiments. Referring to FIGS. 14A and 14B, a chaotic computer 210A may include a plurality of chaotic logic devices 211a to 211z, an initial state setup unit 212, an input value setup unit 213A, a chaotic mode excitation unit 214A, and an output value measuring unit 215. A chaotic computer 210B may include a plurality of chaotic logic devices 211a to 211z, the initial state setup unit 212, an input value setup unit 213B, a chaotic mode excitation unit 214B, and the output value measuring unit 215.

Each of the plurality of chaotic logic devices 211a to 211z may have a structure similar to that of the chaotic logic device 111 described with reference to FIGS. 2 to 13 or may perform an operation similar to that of the chaotic logic device 111. That is, each of the plurality of chaotic logic devices 211a to 211z may be set to an initial state corresponding to a target logical operation by the initial state setup unit 212. In some example embodiments, each of the plurality of chaotic logic devices 211a to 211z may be implemented as separate devices, and different initial states may be individually set.

In some example embodiments, the plurality of chaotic logic devices 211a to 211z may be implemented as a single device. For example, the plurality of chaotic logic devices 211a to 211z may be formed on a plurality of magnetic thin film layers included in the single device, respectively, and may operate based on the operating method described above. Alternatively, the plurality of chaotic logic devices 211a to 211z may be formed on a magnetic thin film layer included in the single device, and may operate based on the operating method described above. In this case, the magnetic thin film layer may include a plurality of spin solitons, and the plurality of spin solitons may respectively correspond to the plurality of chaotic logic devices 211a to 211z.

Operations of the initial state setup unit 212 and the output value measuring unit 215 are similar to operations of the initial state setup unit 112 and the output value measuring unit 115 described above except that the initial state setup unit 212 and the output value measuring unit 215 operate for each of the plurality of chaotic logic devices 211a to 211z, and thus a detailed description thereof is omitted to avoid redundancy.

The input value setup unit 213A, the chaotic mode excitation unit 214A, and the output value measuring unit 215 are similar to those described with reference to FIG. 3A except that the input value setup unit 213A, the chaotic mode excitation unit 214A, and the output value measuring unit 215 operate on each of the plurality of chaotic logic devices 211a to 211z. The input value setup unit 213B, and the chaotic mode excitation unit 214B are similar to those described with reference to FIG. 3B except that the input value setup unit 213B and the chaotic mode excitation unit 214B operate on each of the plurality of chaotic logic devices 211a to 211z. Accordingly, a detailed description thereof is omitted to avoid redundancy.

In some example embodiments, the plurality of chaotic logic devices 211a to 211z may operate independently, individually or in parallel. Alternatively, at least part of the plurality of chaotic logic devices 211a to 211z may operate to be complementary to each other. For example, an output value of the first chaotic logic device 211a among the plurality of chaotic logic devices 211a to 211z may be used to set the input value or initial value of the second chaotic logic device 211b. However, the scope of example embodiments is not limited thereto. It will be understood that an operation between the plurality of chaotic logic devices 211a to 211z may be modified in various ways.

FIG. 15 is a diagram illustrating a system 1000, according to some example embodiments. Basically, the system 1000 of FIG. 15 may be a mobile system such as a mobile phone, a smartphone, a tablet personal computer (PC), a wearable device, a health care device, or an Internet of things (IoT) device. However, the system 1000 of FIG. 15 is not limited to the mobile system. For example, the system 1000 may be a system such as a personal computer, a laptop computer, a server, a media player, or an automotive device such as a navigation device.

Referring to FIG. 15, the system 1000 may include a main processor 1100, memories 1200a and 1200b, and storage devices 1300a and 1300b, and may further include one or more of an image capture device 1410, a user input device 1420, a sensor 1430, a communication device 1440, a display 1450, a speaker 1460, a power supplying device 1470, and a connecting interface 1480.

The main processor 1100 may control overall operations of the system 1000 and, in more detail, may control operations of the remaining components of the system 1000 implementing the system 1000. The main processor 1100 may be implemented with a general-purpose processor, a special-purpose processor, or an application processor.

The main processor 1100 may include one or more CPU cores 1110, and may further include a controller 1120 for controlling the memories 1200a and 1200b and/or the storage devices 1300a and 1300b. According to some example embodiments, the main processor 1100 may further include an accelerator 1130 being a dedicated circuit for high-speed data computation such as artificial intelligence (AI) data computation. The accelerator 1130 may include a graphics processing unit (GPU), a neural processing unit (NPU), and/or a data processing unit (DPU) and may be implemented with a separate chip physically independent of any other component of the main processor 1100.

The memories 1200a and 1200b may be used as main memory devices of the system 1000. Each of the memories 1200a and 1200b may include volatile memories such as SRAM and/or DRAM, and may also include non-volatile memories such as a flash memory, PRAM and/or RRAM. The memories 1200a and 1200b may be implemented within the same package as the main processor 1100.

The storage devices 1300a and 1300b may function as non-volatile storage devices that store data regardless of whether power is supplied, and may have a storage capacity larger than the memories 1200a and 1200b. The storage devices 1300a and 1300b may include the storage controllers 1310a and 1310b and non-volatile memories (NVM) 1320a and 1320b storing data under control of the storage controllers 1310a and 1310b. Each of the non-volatile memories 1320a and 1320b may include a flash memory of a two-dimensional (2D) structure and/or a vertical NAND (V-NAND) flash memory of a three-dimensional structure, and/or may include a different kind of nonvolatile memory such as one a PRAM and/or an RRAM.

The storage devices 1300a and 1300b may be included in the system 1000 in a state of being physically separated from the main processor 1100 or may be implemented within the same package as the main processor 1100. Moreover, the storage devices 1300a and 1300b may be detachably coupled to other components of the system 1000 through an interface such as the connecting interface 1480 to be described later by having a form such as a solid state device (SSD) or a memory card. Such the storage devices 1300a and 1300b may include a device to which the standard such as one or more of universal flash storage (UFS), embedded multi-media card (eMMC), or non-volatile memory express (NVMe) is applied, not limited thereto.

The image capture device 1410 may photograph (or capture) a still image or a moving image and may include a camera, a camcorder, and/or a webcam.

The user input device 1420 may receive various types of data input by a user of the system 1000 and may include a touch pad, a keypad, a keyboard, a mouse, and/or a microphone.

The sensor 1430 may detect various types of physical quantities capable of being obtained from the outside of the system 1000 and may convert the detected physical quantities to electrical signals. The sensor 1430 may include a temperature sensor, a pressure sensor, an illumination sensor, a position sensor, an acceleration sensor, a biosensor, and/or a gyroscope sensor.

The communication device 1440 may transmit and receive signals between other devices outside the system 1000 according to various communication protocols. The communication device 1440 may be implemented to include an antenna, a transceiver, and/or a MODEM.

The display 1450 and the speaker 1460 may function as an output device that outputs visual information and auditory information to the user of the system 1000.

The power supplying device 1470 may appropriately convert a power supplied from a battery (not illustrated) embedded in the system 1000 and/or an external power source so as to be supplied to each component of the system 1000.

The connecting interface 1480 may provide a connection between the system 1000 and an external device that is connected to the system 1000 and capable of exchanging data with the system 1000. The connecting interface 1480 may be implemented with various interfaces such as one or more of an Advanced Technology Attachment (ATA) interface, an Serial ATA (SATA) interface, an external SATA (e-SATA) interface, an Small Computer Small Interface (SCSI) interface, an Serial Attached SCSI (SAS) interface, a Peripheral Component Interconnection (PCI) interface, a PCI express (PCIe) interface, an NVM express (NVMe) interface, an IEEE 1394 interface, an Universal Serial Bus (USB) interface, an Secure Digital (SD) card interface, an Multi-Media Card (MMC) interface, an embedded Multi-Media Card (eMMC) interface, an Universal Flash Storage (UFS) interface, an embedded Universal Flash Storage (eUFS) interface, and a Compact Flash (CF) card interface.

In some example embodiments, the system 1000 of FIG. 15, at least part of the various components included in the system 1000, or at least part of operating devices may be implemented with the chaotic computers 110 and 210 described with reference to FIGS. 2 to 14. For example, at least part of the main processor 1100, the CPU core 1110 included in the main processor 1110, or the accelerator 1130 included in the main processor 1110 may be implemented with the chaotic computers 110 and 210 described with reference to FIGS. 2 to 14, thereby improving the overall system performance.

The above description refers to detailed embodiments for carrying out example embodiments. Embodiments in which a design is changed simply or which are easily changed may be included in example embodiments as well as some example embodiments described above. In addition, technologies that are easily changed and implemented by using the above embodiments may be included. While example embodiments have been described with reference to embodiments described above, it will be apparent to those of ordinary skill in the art that various changes and modifications may be made thereto without departing from the spirit and scope of the present disclosure as set forth in the following claims, and further that example embodiments are not necessarily mutually exclusive with one another. For example, some example embodiments may include one or more features described with reference to one or more figures, and may also include one or more other features described with reference to one or more other figures.

According to some example embodiments, a chaotic computer system may perform various logical operations by using a chaotic logic device (e.g., a single device) based on dynamic characteristics of a topology spin soliton. Accordingly, it may be easy to switch between logical operations, and/or it may be possible to perform a high-speed logical operation. Accordingly, a chaotic computer including a spin soliton having improved performance and/or reduced costs, a method of operating the chaotic computer, and/or a chaotic computing method using a spin soliton are provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various inventive concepts have been described with reference to various example embodiments thereof, it will be apparent to those of ordinary skill in the art that various changes and modifications may be made thereto without departing from the spirit and scope of example embodiments as set forth in the following claims.

What is claimed is:

1. An operating method of a chaotic computer including a chaotic logic device, the method comprising:
    setting a first initial value based on a first initial state corresponding to a first logical operation;
    applying the set first initial value to the chaotic logic device;
    setting a first input value to be applied to the chaotic logic device based on first input data;
    applying the first input value to the chaotic logic device;
    generating a chaos signal to have the chaotic logic device operate in a chaotic mode;
    applying the chaos signal to the chaotic logic device; and
    measuring a first output value from the chaotic logic device operating based on the first input value and by the chaos signal;
    generating first output data based on the first output value, wherein the chaotic logic device includes a magnetic thin film configured to have a spin soliton formed therein.

2. The method of claim 1, wherein the first initial value includes a first magnetic field and a second magnetic field that are applied to a plane on which the spin soliton is formed, and a third magnetic field applied in a direction perpendicular to the plane.

3. The method of claim 2, wherein
the first initial state indicates a location of a central spin of the spin soliton, and a shape of the spin soliton,
the first magnetic field and the second magnetic field change the location of the central spin of the spin soliton, and
the third magnetic field changes the shape of the spin soliton.

4. The method of claim 1, wherein
the first input value includes at least one of a first physical quantity applied in a first direction on a plane where the spin soliton is formed, a second physical quantity applied in a second direction perpendicular to the first direction on the plane, or a third physical quantity applied in a direction perpendicular to the plane, and
at least one of the first physical quantity, the second physical quantity, or the third physical quantity are based on at least one of a static magnetic field, an electrostatic field, an alternating electric field, a linear alternating magnetic field, a circular alternating magnetic field, an alternating current, a vertical current, and a spin current, which are configured to drive the spin soliton.

5. The method of claim 1, wherein the chaos signal has strength greater than or equal to a threshold point corresponding to the chaotic mode.

6. The method of claim 5, wherein the threshold point corresponds to a strength at which a maximum Lyapunov exponent of the spin soliton is positive.

7. The method of claim 1, wherein
the first output value corresponds to at least one of whether a central spin of the spin soliton of the chaotic logic device is reversed, or a speed change of the central spin, and
the first output value is measured by measuring at least one of a change in magnetic resistance of the chaotic logic device, or a change in an induced current of the chaotic logic device.

8. The method of claim 1, further comprising:
setting a second initial value based on a second initial state corresponding to a second logical operation different from the first logical operation;
applying the second initial value to the chaotic logic device;
applying the first input value and the chaos signal to the chaotic logic device;
measuring a second output value caused from the chaotic logic device based on the first input value and by the chaos signal; and
generating second output data based on the second output value.

9. The method of claim 8, wherein
the first output data corresponds to a result of the first logical operation for the first input data, and
the second output data corresponds to a result of the second logical operation for the first input data.

10. The method of claim 1, wherein the spin soliton includes at least one of spin structures of a skyrmion, a vortex, a skyrmionium, a meron, a hopfion, an antiparticle, and a twin particle.

11. The method of claim 1, wherein the chaotic logic device includes at least one of,
a material including a ferromagnetic material including one or more of cobalt (Co), iron (Fe), nickel (Ni), an iron-cobalt alloy, or a cobalt-iron-boron alloy, in contact with a thin film having strong spin-orbit coupling, the thin film including at least one of platinum (Pt), tungsten (W), and tantalum (Ta) are in contact with each other, or
a material which has broken inversion symmetry in a crystal structure, the material including one or more of a silicon-manganese alloy (MnSi), a silicon-iron-cobalt alloy (Fe1-xCoxSi), or iron-germanium (FeGe).

12. A chaotic computing method using a spin soliton, the method comprising:
setting the spin soliton to a first initial state;
applying a first input value based on first input data and on a chaos signal to the spin soliton;
while the spin soliton of the first initial state generates a chaotic behavior in response to the first input value and to the chaos signal, measuring a first output value and generating first output data based on the first output value;
setting the spin soliton to a second initial state;
applying the first input value and the chaos signal to the spin soliton; and
while the spin soliton of the second initial state generates a chaotic behavior in response to the first input value and the chaos signal, measuring a second output value and generating second output data based on the second output value,
wherein each of the first initial state and the second initial state of the spin soliton independently indicates at least one of a location of a central spin of the spin soliton or a shape of the spin soliton.

13. The method of claim 12, wherein the spin soliton includes at least one of spin structures of a skyrmion, a vortex, a skyrmionium, a meron, a hopfion, an antiparticle, and a twin particle.

14. The method of claim 12, wherein
the first output data corresponds to a result of a first logical operation for the first input data, and
the second output data corresponds to a result of a second logical operation, which is different from the first logical operation, for the first input data.

15. The method of claim 12, wherein each of the first initial state and the second initial state of the spin soliton indicates the location of the central spin of the spin soliton and the shape of the spin soliton.

16. The method of claim 12, wherein the chaos signal has strength greater than or equal to a threshold point of the spin soliton such that the spin soliton generates the chaotic behavior.

17. A chaotic computer comprising:
a chaotic logic device including a magnetic thin film configured to have a spin soliton formed therein; and
a processor configured to execute machine-readable instructions that, when executed by the processor, cause the chaotic computer to generate an initial value to be applied to the chaotic logic device based on an initial state corresponding to a target logical operation,
to generate an input value to be applied to the chaotic logic device based on input data,
to generate a chaos signal such that the chaotic logic device operates in a chaotic mode, and
to measure an output value from the chaotic logic device and to generate output data based on the output value while the chaotic logic device operates in the chaotic mode in response to the input value and the chaos signal, wherein the output data corresponds to a result of the target logical operation for the input data.

18. The chaotic computer of claim 17, wherein the spin soliton includes at least one of spin structures of a skyrmion, a vortex, a skyrmionium, a meron, a hopfion, an antiparticle, and a twin particle.

19. The chaotic computer of claim 17, wherein at least one of a location of a central spin of the spin soliton or a shape of the spin soliton is changed by the initial value.

20. The chaotic computer of claim 17, wherein the processor is configured to control the chaos signal such that the chaos signal has a frequency of a nonlinear mode of the spin soliton, and strength greater than or equal to a threshold point.

* * * * *